United States Patent
Pershing

(10) Patent No.: US 10,685,149 B2
(45) Date of Patent: *Jun. 16, 2020

(54) PITCH DETERMINATION SYSTEMS AND METHODS FOR AERIAL ROOF ESTIMATION

(71) Applicant: Eagle View Technologies, Inc., Bothell, WA (US)

(72) Inventor: Chris Pershing, Redmond, WA (US)

(73) Assignee: Eagle View Technologies, Inc., Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/019,227

(22) Filed: Jun. 26, 2018

(65) Prior Publication Data

US 2019/0138665 A1    May 9, 2019

Related U.S. Application Data

(63) Continuation of application No. 15/832,363, filed on Dec. 5, 2017, now abandoned, which is a continuation
(Continued)

(51) Int. Cl.
| | | |
|---|---|---|
| *G06F 17/50* | (2006.01) | |
| *G06F 17/10* | (2006.01) | |

(Continued)

(52) U.S. Cl.
CPC ......... *G06F 30/13* (2020.01); *G06K 9/00637* (2013.01); *G06T 7/12* (2017.01);
(Continued)

(58) Field of Classification Search
CPC . G06T 7/0042; G06T 7/0083; G06T 2200/24; G06T 2207/30184;
(Continued)

(56) References Cited

U.S. PATENT DOCUMENTS

| | | |
|---|---|---|
| 2,791,151 A | 5/1957 | Pennington |
| 3,617,016 A | 11/1971 | Bolsey |
| | (Continued) | |

FOREIGN PATENT DOCUMENTS

| | | |
|---|---|---|
| AU | 2008230031 B8 | 11/2009 |
| CA | 2191954 A1 | 12/1995 |
| | (Continued) | |

OTHER PUBLICATIONS

"3D Reconstruction," retrieved Oct. 25, 2013, from http://www8cs.umu.se/kurser/TDBD19/V705/reconstruct-4.pdf, 5 pages.
(Continued)

*Primary Examiner* — Andre Pierre Louis
(74) *Attorney, Agent, or Firm* — Dunlap Codding, P.C.

(57) ABSTRACT

User interface systems and methods for roof estimation are described. Example embodiments include a roof estimation system that provides a user interface configured to facilitate roof model generation based on one or more aerial images of a building roof. In one embodiment, roof model generation includes image registration, image lean correction, roof section pitch determination, wire frame model construction, and/or roof model review. The described user interface provides user interface controls that may be manipulated by an operator to perform at least some of the functions of roof model generation. In one embodiment, the user interface provides user interface controls that facilitate the determination of pitch of one or more sections of a building roof. This abstract is provided to comply with rules requiring an abstract, and it is submitted with the intention that it will not be used to interpret or limit the scope or meaning of the claims.

20 Claims, 29 Drawing Sheets

Related U.S. Application Data of application No. 14/841,523, filed on Aug. 31, 2015, now abandoned, which is a continuation of application No. 14/449,045, filed on Jul. 31, 2014, now Pat. No. 9,129,376, which is a continuation of application No. 13/438,288, filed on Apr. 3, 2012, now Pat. No. 8,818,770, which is a continuation of application No. 12/467,244, filed on May 15, 2009, now Pat. No. 8,170,840.

(60) Provisional application No. 61/197,904, filed on Oct. 31, 2008.

(51) Int. Cl.

| | | |
|---|---|---|
| *G06G 7/60* | (2006.01) | |
| *G06F 30/13* | (2020.01) | |
| *G06T 17/20* | (2006.01) | |
| *G06T 7/30* | (2017.01) | |
| *G06T 7/73* | (2017.01) | |
| *G06T 7/12* | (2017.01) | |
| *G06K 9/00* | (2006.01) | |

(52) U.S. Cl.
CPC .................. *G06T 7/30* (2017.01); *G06T 7/73* (2017.01); *G06T 7/75* (2017.01); *G06T 17/20* (2013.01); *G06T 2200/24* (2013.01); *G06T 2207/10032* (2013.01); *G06T 2207/20104* (2013.01); *G06T 2207/30108* (2013.01); *G06T 2207/30184* (2013.01); *G06T 2207/30204* (2013.01)

(58) Field of Classification Search
CPC ........... G06T 2207/10032; G06F 17/20; G06F 17/5004; G06K 9/00637
USPC ........................................................ 703/1, 2
See application file for complete search history.

(56) References Cited

U.S. PATENT DOCUMENTS

| | | | |
|---|---|---|---|
| 5,247,356 A | 9/1993 | Ciampa | |
| 5,379,105 A | 1/1995 | Iki et al. | |
| 5,596,494 A | 1/1997 | Kuo | |
| 5,633,946 A | 5/1997 | Lachinski et al. | |
| 5,633,995 A | 5/1997 | McClain | |
| 5,936,628 A | 8/1999 | Kitamura et al. | |
| 5,983,010 A | 11/1999 | Murdock et al. | |
| 6,323,885 B1 | 11/2001 | Wiese | |
| 6,333,749 B1 | 12/2001 | Reinhardt et al. | |
| 6,385,541 B1 | 5/2002 | Blumberg et al. | |
| 6,396,491 B2 | 5/2002 | Watanabe et al. | |
| 6,446,053 B1 | 9/2002 | Elliott | |
| 6,448,964 B1 | 9/2002 | Isaacs et al. | |
| 6,496,184 B1 | 12/2002 | Freeman et al. | |
| 6,636,803 B1 | 10/2003 | Hartz, Jr. et al. | |
| 6,741,757 B1 | 5/2004 | Torr et al. | |
| 6,760,117 B1 | 7/2004 | Slatter | |
| 6,836,270 B2 | 12/2004 | Du | |
| 6,980,690 B1 | 12/2005 | Taylor et al. | |
| 7,003,400 B2 | 2/2006 | Bryant | |
| 7,006,977 B1 | 2/2006 | Attra et al. | |
| 7,133,551 B2 | 11/2006 | Chen et al. | |
| 7,233,691 B2 | 6/2007 | Setterholm | |
| 7,305,983 B1 | 12/2007 | Meder et al. | |
| 7,324,666 B2 | 1/2008 | Zoken et al. | |
| 7,327,880 B2 | 2/2008 | Tek | |
| 7,333,963 B2 | 2/2008 | Widrow et al. | |
| 7,343,268 B2 | 3/2008 | Kishikawa | |
| 7,373,303 B2 | 5/2008 | Moore et al. | |
| 7,376,284 B2 | 5/2008 | Tao et al. | |
| 7,424,133 B2 | 9/2008 | Schultz et al. | |
| 7,428,337 B2 | 9/2008 | Gao et al. | |
| 7,460,214 B2 | 12/2008 | Schiavi | |
| 7,487,114 B2 | 2/2009 | Florance et al. | |
| 7,500,391 B2 | 3/2009 | Woro | |
| 7,509,241 B2 | 3/2009 | Guo et al. | |
| 7,519,206 B2 | 4/2009 | Mulet-Parada et al. | |
| 7,583,275 B2 | 9/2009 | Neumann et al. | |
| 7,639,842 B2 | 12/2009 | Kelle et al. | |
| 7,728,833 B2 | 6/2010 | Verma et al. | |
| 7,752,018 B2 | 7/2010 | Rahmes et al. | |
| 7,787,659 B2 | 8/2010 | Schultz et al. | |
| 7,844,499 B2 | 11/2010 | Yahiro et al. | |
| 7,869,944 B2 | 1/2011 | Deaton et al. | |
| 7,873,238 B2 | 1/2011 | Schultz et al. | |
| 7,920,963 B2 | 4/2011 | Jouline et al. | |
| 7,950,579 B2 | 5/2011 | Gray et al. | |
| 7,991,226 B2 | 8/2011 | Schultz et al. | |
| 7,995,799 B2 | 8/2011 | Schultz et al. | |
| 7,995,862 B2 | 8/2011 | Tao et al. | |
| 8,051,089 B2 | 11/2011 | Gargi et al. | |
| 8,068,643 B2 | 11/2011 | Schultz et al. | |
| 8,078,436 B2 | 12/2011 | Pershing et al. | |
| 8,081,798 B2 | 12/2011 | Paglieroni et al. | |
| 8,081,841 B2 | 12/2011 | Schultz et al. | |
| 8,131,514 B2 | 3/2012 | Royan et al. | |
| 8,145,578 B2 | 3/2012 | Pershing et al. | |
| 8,170,840 B2 | 5/2012 | Pershing | |
| 8,204,341 B2 | 6/2012 | Schultz et al. | |
| 8,209,152 B2 | 6/2012 | Pershing | |
| 8,233,666 B2 | 7/2012 | Schultz et al. | |
| 8,385,672 B2 | 2/2013 | Giuffrida et al. | |
| 8,401,222 B2 | 3/2013 | Thornberry et al. | |
| 8,417,061 B2 | 4/2013 | Kennedy et al. | |
| 8,437,554 B2 | 5/2013 | Kim et al. | |
| 8,471,854 B2 | 6/2013 | Kelley et al. | |
| 8,477,190 B2 | 7/2013 | Giuffrida et al. | |
| 8,520,079 B2 | 8/2013 | Schultz et al. | |
| 8,531,472 B2 | 9/2013 | Freund et al. | |
| 8,538,151 B2 | 9/2013 | Shimamura et al. | |
| 8,538,918 B1 | 9/2013 | Pearcy et al. | |
| 8,588,547 B2 | 11/2013 | Giuffrida et al. | |
| 8,593,518 B2 | 11/2013 | Schultz et al. | |
| 8,670,961 B2 | 3/2014 | Pershing et al. | |
| 8,825,454 B2 | 9/2014 | Pershing et al. | |
| 9,135,737 B2 | 9/2015 | Pershing | |
| 2002/0010594 A1 | 1/2002 | Levine | |
| 2002/0101594 A1 | 8/2002 | Slatter | |
| 2002/0143669 A1 | 10/2002 | Scheer | |
| 2002/0154174 A1 | 10/2002 | Redlich et al. | |
| 2003/0014224 A1 | 1/2003 | Guo et al. | |
| 2003/0028393 A1 | 2/2003 | Coulston et al. | |
| 2003/0103651 A1 | 6/2003 | Novak | |
| 2003/0147553 A1 | 8/2003 | Chen et al. | |
| 2003/0171957 A1 | 9/2003 | Watrous | |
| 2003/0233310 A1 | 12/2003 | Stavrovski | |
| 2004/0105573 A1 | 6/2004 | Neumann et al. | |
| 2005/0129306 A1 | 6/2005 | Wang et al. | |
| 2005/0267657 A1 | 12/2005 | Devdhar | |
| 2005/0288959 A1 | 12/2005 | Eraker et al. | |
| 2006/0061566 A1 | 3/2006 | Verma et al. | |
| 2006/0137736 A1 | 6/2006 | Nishitani et al. | |
| 2006/0200311 A1 | 9/2006 | Arutunian et al. | |
| 2006/0232605 A1 | 10/2006 | Imamura | |
| 2006/0262112 A1 | 11/2006 | Shimada | |
| 2006/0265287 A1 | 11/2006 | Kubo | |
| 2007/0058850 A1 | 3/2007 | Luo et al. | |
| 2007/0179757 A1 | 8/2007 | Simpson | |
| 2007/0220174 A1 | 9/2007 | Abhyanker | |
| 2008/0162380 A1 | 7/2008 | Suga et al. | |
| 2008/0221843 A1 | 9/2008 | Shenkar et al. | |
| 2008/0262789 A1 | 10/2008 | Pershing et al. | |
| 2010/0179787 A2 | 7/2010 | Pershing et al. | |
| 2010/0241406 A1 | 9/2010 | Rahmes et al. | |
| 2011/0086201 A1 | 4/2011 | Shiao et al. | |
| 2011/0096083 A1 | 4/2011 | Schultz | |
| 2011/0187713 A1 | 8/2011 | Pershing et al. | |
| 2011/0205245 A1 | 8/2011 | Kennedy et al. | |
| 2012/0035887 A1 | 2/2012 | Augenbraun et al. | |
| 2012/0209782 A1 | 8/2012 | Pershing et al. | |
| 2012/0224770 A1 | 9/2012 | Strassenburg-Kleciak | |

(56) References Cited

U.S. PATENT DOCUMENTS

| | | | |
|---|---|---|---|
| 2013/0202157 | A1 | 8/2013 | Pershing |
| 2013/0204575 | A1 | 8/2013 | Pershing |
| 2013/0216089 | A1 | 8/2013 | Chen et al. |
| 2013/0226515 | A1 | 8/2013 | Pershing et al. |
| 2013/0262029 | A1 | 10/2013 | Pershing |
| 2013/0346020 | A1 | 12/2013 | Pershing |

FOREIGN PATENT DOCUMENTS

| | | | |
|---|---|---|---|
| CA | 2641373 | A1 | 10/2009 |
| CN | 102194120 | A | 9/2011 |
| DE | 198 57 667 | A1 | 8/2000 |
| EP | 1 010 966 | B1 | 10/2002 |
| EP | 2 251 833 | A2 | 11/2010 |
| WO | 00/29806 | A2 | 5/2000 |
| WO | 2005/124276 | A2 | 12/2005 |
| WO | 2006/040775 | A2 | 4/2006 |
| WO | 2006/090132 | A2 | 8/2006 |
| WO | 2009/046459 | A1 | 4/2009 |
| WO | WO 2009/046459 | | 4/2009 |
| WO | WO2009/046459 | A1 | 4/2009 |
| WO | 2011/094760 | A2 | 8/2011 |

OTHER PUBLICATIONS

"8. Epipolar Geometry and the Fundamental Matrix," retrieved Oct. 25, 2013, from http://www.robtos.ox.ac.uk/~vgg/hzbook/hzbook1/HZepipolar.pdf, 25 pages.
"AeroDach® Online Roof Evaluation Standard Delivery Format and 3D Data File," Document Version 01.00.2002 with alleged publication in 2002, 21 pages.
"AeroDach® Online Dachauswertung: Standardlieferformat und 3D-Datensatz," AEROWEST GMBH,Version 01.00.2002, 6 pages.
"Aerodach® Online Roof Analysis: Standard Delivery Format and 3D Dataset," AEROWESTGmbH, Version as of 00-01-2002, 6 pages.
"AppliCad Software and EagleView® Technologies Partner for Metal Roofing Contractors," EagleView Technologies and AppliCad Software, retrieved from blog.eagleview.com/?=614 on Feb. 1, 2012, 2 pages.
"Definitions of Surveying and Associated Terms," American Congress on Surveying and Mapping, reprinted 1989, p. 3, 2 pages.
"Glossary of the Mapping Sciences," American Society of Civil Engineering, ASCE Publications, 1994, pp. 9-10, 3 pages.
"Microsoft's MSN Virtual Earth: The Map is the Search Platform," Directions Magazine URL=http://www.directionsmag.com/article.php?article_id=873&trv=1, retrieved Feb. 6, 2009, 10 pages.
"Photo Tours Google," Web Search, retrieved Oct. 25, 2013, from http://www.google.com/search?q=photo+tours=google, 2 pages.
"Pictometry—In the News," URL=http://204.8.121.114/pressrelease%20archived/pressrelease_aec.asp, retrieved Feb. 6, 2009, 3 pages.
"Software; New Products," LexisNexis Roofing Contractor article 23(2):121(2), Jan. 3, 2006, 1 page.
"Sorcerer: Nobody builds roofs like this builds roofs," retrieved from URL=http://web.archive.org/web/2006021409237/http://www.applicad.com.au/product-features . . . on Mar. 29, 2012, 2 pages.
Aerodach, "Protokoll zur Dachauswertung," Oct. 19, 2010, 12 pages.
Aerowest GMBH, "AeroDach—das patentierte Dachaufmass," Jan. 1, 2006, retrieved from URL=http://web.archive.org/web/20060101021543/http://www.aerowest.de/aerodach.html on Mar. 25, 2012, 2 pages.
Aerowest Gmbh, "Aerowest Pricelist of Geodata," Oct. 21, 2005, 2 pages.
Aerowest Gmbh, "Geodata Service; AeroDach—Patented Roof Dimensions," Jan. 1, 2006, retrieved from URL=http://web.archive.org/web/20060101021543/http://www.aerowest.de/aerodach.html, on Mar. 25, 2012, 2 pages.
Aerowest Gmbh. "Preisliste Geodaten Aerowest," Oct. 21, 2005, 1 page.

Agarwal et al., "Reconstructing Rome," *IEEE Computer* 43(6): 40-47, Jun. 2010.
Agarwal et al., "Building Rome in a Day," *Communications of the ACM* 54(10): 105-112, Oct. 2011.
Agarwala et al., "Interactive Digital Photomontage," ACM SIGGRAPH 2004, Los Angeles, CA, Aug. 2004, 9 pages.
Agarwala et al., "Panoramic Video Textures," SIGGRAPH 2005, Los Angeles, CA, Aug. 2005, 8 pages.
Appli-cad Australia, "Linear Nesting Reports," AppliCad Sample Reports, Jul. 18, 2000, 9 pages.
Appli-cad Australia, "Roof Magician: Especially suited to single, shake and tile roofing," Sample Reports, Jun. 24, 2004, 13 pages.
Appli-cad Australia, "Roof Wizard: Advanced Software for Roof Modeling and Estimating," Document Issue 1.0.0, Sep. 25, 2004, 10 pages.
Appli-cad Australia, "Roof Wizard: Especially suited to metal roofing," Generate Offcuts Reports, Mar. 9, 2005, 7 pages.
Appli-cad Australia, "Roof Wizard: Especially suited to metal roofing," Generate Offcuts Reports, Sep. 14, 2006, 7 pages.
Appli-cad Australia, "Roof Wizard: Especially suited to metal roofing," Sample Reports, Jul. 13, 2004, 24 pages.
Appli-cad Australia, "Roof Wizard: Especially suited to metal roofing," Sample Reports, Sep. 17, 2002, 12 pages.
Appli-cad Australia, "Sorcerer: Advanced Software for Roof Modeling and Estimating," Reference Guide Version 3, Sep. 8, 1999, 142 pages.
Appli-cad Australia, "Sorcerer: The complete solution for professional roof estimating," Demonstration Kit, Mar. 9, 2005, 15 pages.
AppliCad Roofing, sample report dated Jul. 30, 2007, 1 page.
Applicad Roofing, sample report dated Mar. 2, 2005, 28 pages.
AppliCad USA, "Linear Nesting Reports," AppliCad Sample Reports, Nov. 25, 1999, 9 pages.
Applicad webpage 2005 snip different color lines, 1 page.
AppliCad, "Example Output and Brochures," retrieved from URL= http://www.applicad.com/au/product-reports.html on Apr. 16, 2012, 2 pages.
AppliCad, "Product Overview—Sorcerer: Advanced Software for Roofing Modeling, Estimating, Presentation and Installation," Issue 5, Mar. 2, 2001, 15 pages.
AppliCad, "Roofing Software: Product Bulletin Section 1—Modeling the Roof," Dec. 20, 2005, retrieved from URL=htpp://web.archive.org/web/20021122204408/http://www.applicad.com.au/ on Apr. 16, 2012, 3 pages.
AppliCad, "Roofing Software: Product Bulletin Section 1—Modeling the Roof," Jan. 7, 2002, retrieved from URL=htpp://web.archive.org/web/20021122204408/http://www.applicad.com.au/ on Apr. 16, 2012, 3 pages.
AppliCad, "Roofing Software: Product Bulletin Section 2—Modifying the Model," Dec. 20, 2005, retrieved from URL=http://web.archive.org/web/20051210130430/http://www.applicad.com.au/ on Apr. 16, 2012, 2 pages.
AppliCad, "RoofScape: Advanced Software for Roof Modeling and Estimating," Learning Guide (English Units), Revision 1.1, Aug. 2007, 48 pages.
Atkinson, "Therory of Close Range Photogrammetry," Chapter 2, Section 1, Coordinate Transformations, retrieved Oct. 21, 2013, from http://www.lems.brown.edu/vision/people/leymarie/Refs/Photogrammetry/Atkinson90/C . . . , 5 pages.
Australian Office Action for Australian Application No. 2010201839, dated Apr. 14, 2011, 2 pages.
Australian Office Action, for Australian Application No. 2013203507, dated Oct. 1, 2014, 3 pages.
Autodesk, "Autodesk ImageModeler—Features," retrieved on Sep. 30, 2008, from http:///usa.autodesk.com/adsk/servlet/index?siteID= 123112&id=115639 . . . , 1 page.
Automatic House Reconstruction, retrieved on Sep. 29, 2008, from http://www.vision.ee.ethz.ch/projects/Amobe_I/recons.html, 7 pages.
Azuma et al., "View-dependent refinement of multiresolution meshes with subdivision connectivity," *Proceedings of the Second International Conference on Computer Graphics, Virtual Reality, Visualization, and Interaction (Afigraph 2003)*, Capetown, South Africa, Feb. 2003, pp. 69-78.

(56) References Cited

OTHER PUBLICATIONS

Baillard et al., :Automatic reconstruction of piecewise planar models from multiple views, CVPR99, vol. 2, 1999, pp. 559-565, 7 pages.
Bazaraa et al., *Nonlinear Programming Theory and Algorithms*, Second Edition, John Wiley & Sons, Inc., New York, 1993, 330 pages.
Bhat et al., "A Perceptually-Motivated Optimization-Framework for Image and Video Processing," Computer Science & Engineering Technical Report, UW-CSE-08-06-02, University of Washington, Seattle, WA, Jun. 2008, 10 pages.
Bhat et al, "Fourier Analysis of the 2D Screened Poisson Equation for Gradient Domain Problems," ECCV 2008, 14 pages.
Bhat et al., "GradientShop: A Gradient-Domain Optimization Framework for Image and Video Filtering," ACM TOG 29(2), Mar. 2010, 14 pages.
Bhat et al., "Piecewise Image Registration in the Presence of Large Motions," CVPR 2006, New York, NY, Jun. 2006, 7 pages.
Bhat et al., "Using Photographs to Enhance Videos of a Static Scene," Eurographics Symposium on Rendering 2007, 12 pages.
Bignone et al., "Automatic Extraction of Generic House Roofs from High Resolution Aerial Imagery," *Proc. ECCV*, 1996, 12 pages.
Canadian Office Action, for Canadian Application No. 2,641,373, dated Jan. 9, 2012, 4 pages.
Canadian Office Action, dated Mar. 24, 2014, for Canadian Application No. 2,703,423, 2 pages.
Capell et al., "A Multiresolution Framework for Dynamic Deformations," Computer Science & Engineering Technical Report, UW-CSE-02-04-02, University of Washington, Seattle, WA, Apr. 2002, 8 pages.
Chevrier et al., "Interactive 3D reconstruction for urban areas—An image based tool," *CAAD Futures*, 2001, 13 pages.
Chuang et al., "A Bayesian Approach to Digital Matting," IEEE Computer Vision and Pattern Recognition 2001, Kauai, Hawaii, Dec. 2001, 8 pages.
Chuang et al., "Animating Pictures with Stochastic Motion Textures," SIGGRAPH 2005, Los Angeles, CA, Aug. 2005, 8 pages.
Chuang et al., "Animating Pictures with Stochastic Motion Textures," Technical Report UW-CSE-04-04-02, SIGGRAPH 2005, Los Angeles, CA, Aug. 2005, 7 pages.
Chuang et al., "Environment Matting Extensions: Towards Higher Accuracy and Real-Time Capture," SIGGRAPH 2000, New Orleans, LA, Jul. 24-28, 2000, 11 pages.
Chuang et al., "Environment Matting Extensions: Towards Higher Accuracy and Real-Time Capture," Tech Report, SIGGRAPH 2000, New Orleans, LA, Jul. 24-28, 2000, 10 pages.
Chuang et al., "Shadow Matting and Compositing," SIGGRAPH 2003, San Diego, CA, Jul. 2003, 7 pages.
Ciarcia et al., "Automated Roof Identification Systems and Methods," U.S. Appl. No. 12/590,131, filed Nov. 2, 2009, 74 pages.
Ciarcia et al., "Automated Roof Identification Systems and Methods," U.S. Appl. No. 12/590,131, Notice of Allowance, dated Aug. 26, 2013, 9 pages.
Ciarcia et al., "Automated Roof Identification Systems and Methods," Office Action dated Jan. 9, 2013, for U.S. Appl. No. 12/590,131, 14 pages.
Ciarcia, "Systems and Methods for Point-to-Point Registration Using Perspective Imagery From Independent Sources Without Image Acquisition Metadata," U.S. Appl. No. 13/646,466, filed Oct. 5, 2012, 41 pages.
Colburn et al., "Image-Based Remodeling," IEEE Transactions on Visualization and Computer Graphics, vol. 19, No. 1, Jan. 2013, 11 pages.
Curless et al., "Better Optical Triangulation Through Spacetime Analysis," Computer Systems Laboratory Technical Report CSL-TR-95-667, Stanford University, Stanford, CA, Apr. 1995, 12 pages.
Curless et al., "Computer model and 3D fax of Happy Buddha," retrieved Oct. 25, 2013, from http://www-graphics.stanford.edu/projects/faxing/happy/, 4 pages.

Curless et al., "A Volumetric Method for Building Complex Models from Range Images," SIGGRAPH '96, New Orleans, LA, Aug. 4-9, 1996, 10 pages.
Curless et al., "Better Optical Triangulation through Spacetime Analysis," 1995 $5^{th}$ International Conference on Computer Vision, Boston, MA, Jun. 20-23, 1995, 8 pages.
Curless, "New Methods for Surface Reconstruction from Range Images," Dissertation, Submitted to the Department of Electrical Engineering and the Committee of Graduate Studies of Stanford University, Jun. 1997, 209 pages.
Curless, "From Range Scans to 3D Models," *ACM SIGGRAPH Computer Graphics* 33(4): 38-41, 1999.
Debevec et al., "Modeling and Rendering Architecture from Photographs: A hybrid geometry—and image-based approach," *SIGGRAPH conference proceedings*, retrieved from www.cs.berkeley.edu/~malik/papers/debevecTM96.pdf., 1996, 10 pages.
Delaney, "Searching for Clients From Above—More Small Businesspeople Use Aerial Mapping Services to Scout Potential Customers," *The Wall Street Journal*, Jul. 31, 2007, retrieved on Feb. 25, 2010, from http://online.wsj.com/public/article/SB118584306224482891.html?mod=yahoo_free, 3 pages.
Drawing received Jan. 31, 2012.
*Eagle View Tech.* v. *Aerialogics LLC*, Case No. 2:12-cv-00618-RAJ, Prior Art Presentation, Aug. 17, 2012, 61 pages.
ECE 390, Introduction to Optimization, Spring 2004, Introductory Course, retrieved Oct. 25, 2013, from http://liberzon.csl.illinois.edu/04ECE390.html, 1 page.
Ekman, "Price Estimation Tool," Office Action for U.S. Appl. No. 13/843,437, dated Aug. 14, 2013, 9 pages.
Falkner et al., *Aerial Mapping 2nd Edition*, Lewis Publishers (CRC Press LLC), 2002, "Chapter 11—Aerotriangulation," 23 pages.
Faugeras et al., "3-D reconstruction of Urban Scenes from Sequences of Images," Institut National De Recherche En Informatique Et En Automatique, No. 2572, Jun. 1995, 27 pages.
Faugeras, "What can be seen in three dimensions with an uncalibrated stereo rig?," *Computer Vision—ECCV '92*: 563-578, 1992. (18 pages).
Fisher et al., *Dictionary of Computer Vision and Image Processing*, John Wiley & Sons, Ltd., West Sussex, England, 2005, 182 pages.
Fritsch, "Introduction into Digital Aerotriangulation," Photogrammetric Week '95, Wichman Verlag, Heidelberg, 1995, pp. 165-171, 7 pages.
Furukawa et al., "Manhattan-world Stereo," CVPR 2009, Miami, Florida, Jun. 2009, 8 pages.
Furukawa et al., "Reconstructing Building Interiors from Images," ICCV 2009, Kyoto, Japan, Sep. 2009, 8 pages.
Furukawa et al, "Towards Internet-scale Multi-view Stereo," CVPR 2010, Jun. 2010, 8 pages.
Georgeiv et al., "Spatio-Angular Resolution Tradeoff in Integral Photography," Proceedings of Eurographics Symposium on Rendering, 2006, 10 pages.
Geospan Corporation, "Digital Geo-Referenced Oblique Aerial Imagery Solution EPP-REP No. 8444 5/13," GEO-NY0000868, 2007, 28 pages.
Goesele et al., "Multi-View Stereo for Community Photo Collections," Proceedings of ICCV 2007, Rio de Janeiro, Brazil, Oct. 2007, 8 pages.
Goesele et al., "Multi-View Stereo Revisited," CVPR 2006, New York, NY, Jun. 2006, 8 pages.
Goldman et al., "Interactive Video Object Annotation," Computer Science & Engineering Technical Report, UW-CSE-07-04-01, University of Washington, Seattle, WA, Apr. 2007, 7 pages.
Goldman et al., "Schematic Storyboarding for Video Editing and Visualization." SIGGRAPH 2006, Boston, MA, Aug. 2006, 10 pages.
Goldman et al., "Shape and Spatially-Varying BRDFs From Photometric Stereo," IEEE Transactions on Pattern Analysis and Machine Intelligence, vol. 32, No. 6, Jun. 2010, 12 pages.
Goldman et al., "Shape and Spatially-Varying BRDFs From Photometric Stereo," ICCV 2005, Beijing, China, Oct. 2005, 8 pages.
Goldman et al., "Video Object Annotation, Navigation, and Composition," UIST 2008, 10 pages.

(56) References Cited

OTHER PUBLICATIONS

Gonzalez et al., *Digital Image Processing*, Addison-Wesley Publishing Company, Inc., Reading, Massachusetts, 1993, 372 pages.
Gülch et al., "On the Performance of Semi-Automatic Building Extraction," In the International Archives of Photogrammetry and Remote Sensing, vol. 23, 8 pages, 1998.
Gupta et al., "Enhancing and Experiencing Spacetime Resolution with Videos and Stills," Computer Science & Engineering Technical Report, UW-CSE-04-08-01, University of Washington, Seattle, WA, Apr. 2008, 6 pages.
Gupta et al., "DuploTrack: A Real-time System for Authoring and Guiding Duplo Block Assembly," UIST 2012, Boston, MA, Oct. 2012, 13 pages.
Gupta et al., "Enhancing and Experiencing Spacetime Resolution with Video and Stills," ICCP 2009, San Francisco, CA, Apr. 2009, 9 pages.
Gupta et al., "Single Image Deblurring Using Motion Density Functions," ECCV 2010, Crete, Greece, Sep. 2010, 14 pages.
Hartley et al., "2.4 A Hierarchy of Transformations", Multiple View Geometry in Computer Vision, Cambridge University Press, Second Edition, 2003, 9 pages.
Hartley et al., "Appendix 6: Iterative Estimation Methods," Multiple View Geometry in Computer Vision, Cambridge University Press, Second Edition, 2003, 34 pages.
Hartley et al., "Invariant and Calibration-Free Methods in Scene Reconstruction and Object Recognition," Final Technical Report, Feb. 28, 1997, 266 pages.
Hartley et al., *Multiple View Geometry in Computer Vision*, Second Edition, Cambridge University Press, Cambridge, England, 2003, 672 pages.
Held et al., "3D Puppetry: A Kinect-based Interface for 3D Animation," UIST 2012, Boston, MA, Oct. 2012, 11 pages.
Henricsson et al., "3-D Building Reconstruction with ARUBA: A Qualitative and Quantitative Evaluation," Institute of Geodesy and Photogrammerty, Swiss Federal Institute of Technology, 2001, 13 pages.
Hudson, "Merging VRML Models: Extending the Use of Photomodeller," Thesis, in TCC 402, Presented to the Faculty of the School of Engineering and Applied Science, University of Virginia, Mar. 23, 1998, 23 pages.
International Preliminary Report on Patentability for International Application No. PCT/US2011/023408, dated Aug. 16, 2012, 7 pages.
International Search Report and Written Opinion for International Application No. PCT/US2013/023502, dated Apr. 30, 2013, 8 pages.
International Search Report for International Application No. PCT/US11/23408, dated Aug. 11, 2011, 2 pages.
International Search Report for International Application No. PCT/US2013/023503, dated Apr. 30, 2013, 5 pages.
Kolman, "Chapter 4, Linear Transformations and Matrices, 4.1: Definition and Examples," Elementary Linear Algebra, Second Edition, Macmillan Publishing Co,. Inc., 1997, 12 pages.
Krainin et al., "Autonomous Generation of Complete 3D Object Models Using Next Best View Manipulation Planning," ICRA 2011, Shanghai, China, May 2011, 7 pages.
Kushal et al., "Photo Tours," 3DimPVT, Oct. 2012, 8 pages.
Levoy et al., "The Digital Michelangelo Project: 3D Scanning of Large Statues," SIGGRAPH 2000, New Orleans, LA, Jul. 24-28, 2000, 14 pages.
Levoy, "The Digital Michelangelo Project," retrieved Oct. 25, 2013, from http://www-graphics.stanford.edu/projects/mich/, 10 pages.
Li et al., "Automated Generation of Interactive 3D Exploded View Diagrams," ACM Transactions on Graphics 27(3), SIGGRAPH 2007, Aug. 2007, 7 pages.
Li et al., "Interactive Cutaway Illustration of Complex 3D Models," ACM Transactions on Graphics 26(3), SIGGRAPH 2007, Aug. 2007, 11 pages.
Lueders, "Infringement Allegations by EagleView Technologies," Feb. 10, 2009, 3 pages.
Mahajan et al., "A Theory of Frequency Domain Invariants: Spherical Harmonic Identities for BRDF / Lighting Transfer and Image Consistency," IEEE Pattern Analysis and Machine Intelligence, 30(2), Feb. 2008, 14 pages.
Mahajan et al., "A Theory of Spherical Harmonic Identities for BRDF/Lighting Transfer and Image Consistency," ECCV 2006, Graz, Austria, May 2006, 14 pages.
Mann, "Roof with a view," *Contract Journal* 431(6552):29, Nov. 23, 2005, 2 pages.
Mikhail et al., *Introduction to Modern Photogrammetry*, John Wiley & Sons, Inc., New York, 2001, 247 pages.
Miller et al., "Miller's Guide to Framing and Roofing," McGraw Hill, New York, pp. 131-136 and 162-163, 2005, 9 pages.
Minialoff, "Introduction to Computer Aided Design," Apr. 2000, 4 pages.
Noronha et al., "Detection and Modeling of Buildings from Multiple Aerial Images," *IEEE Transactions on Pattern Analysis and Machine Intelligence* 23(5):501-518, 2001, 32 pages.
Office Action received in Reexamination of U.S. Pat. No. 8,078,436 B2, Supplemental Reexamination Patent, dated Jul. 25, 2013, 72 pages.
Office Action received in Reexamination of U.S. Pat. No. 8,145,578 B2, Supplemental Reexamination Patent, dated Jul. 25, 2013, 24 pages.
Pershing et al., "Pitch Determination Systems and Methods for Aerial Roof Estimation," Notice of Allowance dated Jun. 13, 2014, for U.S. Appl. No. 13/348,288, 12 pages.
Pershing et al., "Aerial Roof Estimation System and Method," Notice of Allowance dated Feb. 3, 2012, for U.S. Appl. No. 12/148,439, 35 pages.
Pershing et al., "Aerial Roof Estimation System and Method," Office Action dated Apr. 25, 2011, for U.S. Appl. No. 12/148,439, 52 pages.
Pershing et al., "Aerial Roof Estimation System and Method," Office Action dated Aug. 16, 2010, for U.S. Appl. No. 12/148,439, 47 pages.
Pershing et al., "Aerial Roof Estimation System and Method," Office Action dated Aug. 25, 2011, for U.S. Appl. No. 12/148,439, 77 pages.
Pershing et al., "Aerial Roof Estimation System and Method," Office Action dated Oct. 10, 2012, for U.S. Appl. No. 13/371,271, 7 pages.
Pershing et al., "Aerial Roof Estimation System and Method," Notice of Allowance dated Jul. 29, 2013, for U.S. Appl. No. 13/371,271, 15 pages.
Pershing et al., "Aerial Roof Estimation System and Method," U.S. Appl. No. 60/925,072, filed Apr. 17, 2007, 16 pages.
Pershing et al., "Aerial Roof Estimation System and Methods," Office Action dated Aug. 28, 2012, for U.S. Appl. No. 13/287,954, 12 pages.
Pershing et al., "Aerial Roof Estimation System and Methods," Office Action dated May 22, 2013, for U.S. Appl. No. 13/287,954, 25 pages.
Pershing et al., "Aerial Roof Estimation Systems and Methods," Notice of Allowance dated Oct. 14, 2011, for U.S. Appl. No. 12/253,092, 30 pages.
Pershing et al., "Aerial Roof Estimation Systems and Methods," Office Action dated May 10, 2011, for U.S. Appl. No. 12/253,092', 26 pages.
Pershing et al., "Automated Techniques for Roof Estimation," U.S. Appl. No. 61/197,895, filed Oct. 31, 2008, 32 pages.
Pershing et al., "Geometric Correction of Rough Wireframe Models Derived From Photographs," U.S. Appl. No. 61/300,414, filed Feb. 1, 2010, 22 pages.
Pershing, "Concurrent Display Systems ANF Methods for Aerial Roof Estimation," Notice of Allowance dated Feb. 16, 2012, for U.S. Appl. No. 12/467,250, 19 pages.
Pershing, "Concurrent Display Systems ANF Methods for Aerial Roof Estimation," Office Action dated Sep. 7, 2011, for U.S. Appl. No. 12/467,250, 14 pages.
Pershing, "Concurrent Display Systems and Methods for Aerial Roof Estimation," Office Action dated Aug. 28, 2012, for U.S. Appl. No. 13/474,504, 8 pages.

(56) References Cited

OTHER PUBLICATIONS

Pershing, "Concurrent Display Systems and Methods for Aerial Roof Estimation," Office Action dated Jun. 19, 2013, for U.S. Appl. No. 13/474,504, 14 pages.
Pershing, "Pitch Determination Systems and Methods for Aerial Roof Estimation," Notice of Allowance dated Feb. 16, 2012, for U.S. Appl. No. 12/467,244, 20 pages.
Pershing, "Pitch Determination Systems and Methods for Aerial Roof Estimation," Office Action for U.S. Appl. No. 13/438,288, dated Aug. 24, 2012, 8 pages.
Pershing, "Pitch Determination Systems and Methods for Aerial Roof Estimation," Office Action dated May 21, 2013, for U.S. Appl. No. 13/438,288, 11 pages.
Pershing, "Pitch Determination Systems and Methods for Aerial Roof Estimation," Office Action dated Aug. 26, 2011, for U.S. Appl. No. 12/467,244, 17 pages.
Pershing, "User Interface Techniques for Roof Estimation," U.S. Appl. No. 61/197,904, filed Oct. 31, 2008, 62 pages.
Pershing, "Systems and Methods for Estimation of Building Wall Area," Office Action for U.S. Appl. No. 13/757,694, dated Oct. 8, 2013, 15 pages.
Pershing, "Pitch Determination Systems and Methods for Aerial Roof Estimation," Office Action for U.S. Appl. No. 13/438,288, dated Dec. 16, 2013, 23 pages.
Pershing, Concurrent Display Systems and Methods for Aerial Roof Estimation, Office Action for U.S. Appl. No. 13/474,504, dated Dec. 20, 2013, 24 pages.
Pershing, "Systems and Methods for Estimation of Building Floor Area," Notice of Allowance for U.S. Appl. No. 13/757,712, dated Dec. 26, 2013, 18 pages.
Pershing, "Systems and Methods for Estimation of Building Floor Area," Office Action dated Jul. 18, 2013, for U.S. Appl. No. 13/757,712, 18 pages.
Pershing, "Pitch Determination Systems and Methods for Aerial Roof Estimation," Notice of Allowance dated Jun. 13, 2014 , for U.S. Appl. No. 13/438,288, 12 Pages.
PhotoModeler, "Measuring & Modeling the Real World," retrieved Sep. 30, 2008, from http://www.photomodeler.com/products/photomodeler.htm, 2 pages.
Pictometry Online, "Government," Oct. 7, 2008, retrieved Aug. 10, 2011, from http://web.archive.org/web/20081007111115/http:/www.pictometry.com/government/prod . . . , 3 pages.
Pictometry, "Electronics Field Study™ Getting Started Guide," Version 2.7, Jul. 2007, 15 pages.
Pictometry, "FAQs," Sep. 22, 2008, retrieved on Aug. 10, 2011, from http://www.web.archive.org/web/20080922013233/http://www.pictometry.com/about_us/faqs.sht . . . , 3 pages.
Pictometry.com, "Frequently Asked Questions," May 24, 2005, retrieved Mar. 28, 2012, from URL=http://web.archive.org/web/20050524205653/http://pictometry.com/faq.asp, 9 pages.
Pictometry.com, "Frequently Asked Questions," retrieved on Aug. 1, 2005, from http://replay.waybackmachine.org/20050801231818/http:///www.pictometry.com/faq.asp, 10 pages.
Pictometry.com, "Frequently Asked Questions," retrieved on Feb. 10, 2012, from http://replay.waybackmachine.org/20050801231818/http:///www.pictometry.com/faq.asp, 6 pages.
Pictometry, "Frequently Asked Questions," Dec. 2006, retrieved Apr. 9, 2011, from http://replay.waybackmachine.org/20050801231818/http://www.pictometry.com/faq.asp, 10 pages.
Pictometry.com, "Pictometry Announces Software and Web-based Solution for Engineers, Architects, and Planners," Press Release, Jan. 22, 2004, 3 pages.
Poullis et al., "Photogrammetric Modeling and Image-Based Rendering for Rapid Virtual Environment Creation," http://handle.dtic.mil/100.2/ADA433420, 1998, 7 pages.
Precigeo.com, "Welcome to precigeoRoof," URL=http://web.archive.org/web/20070106063144/roof.precigeo.com, retrieved Apr. 30, 2009, 1 page.
Precigeo.com, "Welcome to precigeo™," "Welcome to precigeoRoof," "Why precigeoRoof," "How precigeoRoof Works," "How precigeoRoof Can Help Me," all retrieved on Feb. 26, 2010, from http://web.archive.org/, pp. 1-5; "Why precigeoRisk Works" and :Welcome to precigeoRisk, retrieved on Aug. 14, 2010, from http://web.archive.org, pp. 6-11, 11 pages total.
Precigeo.com, "Welcome to precigeo™," URL=http://web.archive.org/20080110074814/http://www.precigeo.com, retrieved Feb. 17, 2009, 1 page.
Precigo.com, "How precigeoRoof Works," URL=http://web.archive.org/web/20070107012311/roof.precigeo.com/how-precigeo-roof-works.htm, retrieved Apr. 30, 2009, 2 pages.
Reddy et al., "Frequency-Space Decomposition and Acquisition of Light Transport under Spatially Varying Illumination," ECCV 2012, Florence, Italy, Oct. 2012, 15 pages.
RoofCAD, "Satellite Takeoff Tutorial-Pitched Roof," received Jan. 31, 2012, 25 pages.
Scholze et al., "A Probabilistic Approach to building Roof Reconstruction Using Semantic Labeling," *Pattern Recognition* 2449/2002, Springer Berlin/Heidelberg, 2002, 8 pages.
Schutzberg et al., "Microsoft's MSN Virtual Earth: The Map is the Search Platform," *Directions Magazine*, retrieved Feb. 6, 2009, from http://www.directionsmag.com/article.php?article_id=873&try=1, 10 pages.
Seitz et al., "A Comparison and Evaluation of Multi-view Stereo Reconstruction Algorithms," CVPR 2006, New York, NY, Jun. 2006, 8 pages.
Shan et al., "Refractive Height Fields from Single and Multiple Images," CVPR 2012, Providence, RI, Jun. 2012, 8 pages.
Shan et al., "Refractive Height Fields from Single and Multiple Images," CVPR 2012, Providence, RI, Jun. 2012, poster, 1 page.
Sorcerer software screenshot, modified on Sep. 6, 2012, 1 page.
Transcriptions of points of potential interest in the attached YouTube video titled: "Pictometry Online Demo," retrieved Feb. 25, 2010.
University of Washington, College of Arts & Sciences, Mathematics, Course Offerings, Autumn Quarter 2013 and Winter Quarter 2014, retrieved Oct. 25, 2013, from http://www.washington.edu/students/crscat/math.html, 16 pages.
U.S. Appl. No. 60/425,275, filed Nov. 8, 2002, 32 pages.
Wattenberg et al., "Area, Volume, and Torque in Three Dimensions," retrieved on Sep. 24, 2013, from http://www.math.montana.edu/frankw/ccp/multiworld/twothree/atv/learn.htm, 14 pages.
Weeks et al., "A Real-Time, Multichannel System with Parallel Digital Signal Processors," *Proceedings of IEEE International Conference on Acoustics, Speech and Signal Processing (ICASSP 1990)* 3: 1787-1790, Apr. 1990.
Wolf, *Elements of Photogrammetry*, McGraw-Hill Kogakusha, 1974, "Chapter Fourteen: Aerotriangulation; 41-1 Introduction," pp. 351-352, 3 pages.
Wood et al., "Surface Light Fields for 3D Photography," SIGGRAPH 2000, New Orleans, LA, Jul. 24-28, 2000, 10 pages.
Written Opinion for International Application No. PCT/US11/23408, dated Aug. 11, 2011, 5 pages.
Written Opinion for International Application No. PCT/US2013/023503, dated Apr. 30, 2013, 4 pages.
Written Opinion for International Application No. PCT/US2013/023502, dated Apr. 30, 2013, 3 pages.
Wu et al., "Multicore Bundle Adjustment," CVPR 2011, Colorado Springs, CO, Jun. 2011, 8 pages.
Wu et al., "Schematic Surface Reconstruction," CVPR 2012, Providence, RI, Jun. 2012, 1 page.
www.archive.org Web site showing alleged archive of PhotoModeler Web Site http://www.photomodeler.com/pmpro08.html from Feb. 9, 2006 (retrieved Oct. 21, 2013), 4 pages.
www.archive.org Web site showing alleged archive of German Aerowest Web Site http://aerowest.de/ from Feb. 6, 2006 (retrieved Sep. 20, 2012) and translated to English, 61 pages.
www.archive.org Web site showing alleged archive of German AeroDach Web Site http://www.areodach.de from Jun. 13, 2004 (retrieved Sep. 20, 2012) and translations to English, 21 pages.
YouTube, "Pictometry Online Demo," DVD, Feb. 25, 2010.
YouTube, "Pictometry Online Demo," retrieved on Feb. 6, 2006, from http://www.youtube.com/watch?v=jURSKo0OD0, 1 page.
Zhang et al., "Rapid Shape Acquisition Using Color Structured Light and Multi-Pass Dynamic Programming," International Sym-

(56) References Cited

OTHER PUBLICATIONS posium on 3D Data Processing Visualization and Transmission, Padova, Italy, Jun. 2002, 13 pages.
Zhang et al., "Shape and Motion Under Varying Illumination: Unifying Structure from Motion, Photometric Stereo, and Multi-view Stereo," ICCV 2003, Nice, France, Oct. 2003, 8 pages.
Zhang et al., "Spacetime Stereo: Shape Recovery for Dynamic Scenes," CVPR 2003, Madison, Wisconsin, Jun. 2003, 8 pages.
Zheng et al., "A Consistent Segmentation Approach to Image-based Rendering," Technical Report CSE-09-03-02, 2002, 8 pages.
Zheng et al., "Parallax Photography: Creating 3D Cinematic Effects form Stills," Proceedings of Graphics Interface 2009, Kelowna, BC, CA, May 2009, 8 pages.
Ziegler et al., "3D Reconstruction Using Labeled Image Regions," Mitsubishi Research Laboratories, http://www.merl.com, Jun. 2003, 14 pages.
Zongker et al., "Environment Matting and Compositing," SIG-GRAPH '99, Los Angeles, CA, Aug. 9-13, 1999, 10 pages.
"R2V User's Manual, Advanced Raster to Vector Conversion Software," Publicly available Sep. 16, 2000, Able Software Corp., Lexington, MA, 164 pages.
Appli-cad, "World Class Technology Leading the Way in Roofing Software—Product Bulletin," Nov. 2002, 97 pages.
Avrahami et al., "Extraction of 3D Spatial Polygons based on the Overlapping Criterion for Roof Extraction from Aerial Images," Stilla U., Rottensteiner F., Hinz S., (Eds.) CMRT05. IAPRS, vol. 36, Part 3/W24—Vienna, Austria, Aug. 29-30, 2005, 6 pages.
Bertan et al., "Automatic 3D Roof Reconstruction using Digital Cadastral Map, Architectural Knowledge and an Aerial Image," IEEE International Conference on Geoscience and Remote Sensing Symposium, Sep. 2006, pp. 1407-1410, 4 pages.
Declaration of Harold Schuch, in re Inter Partes Review of U.S. Pat. No. 8,170,840, dated Feb. 8, 2016, 39 pages.
Gleicher, "Image Snapping," Advanced Technology Group, Apple Computer, Inc., pp. 183-190, 1995.
Hsieh, "Design and Evaluation of a Semi-Automated Site Modeling System," Digital Mapping Laboratory, School of Computer Science, Carnegie Mellon University, Pittsburgh, PA, CMU-CS-95-195, Nov. 1995, 83 pages.
Läbe et al., "Robust Techniques for Estimating Parameters of 3D Building Primitives," International Society for Photogrammetry and Remote Sensing vol. 32, Part 2, Commission II, Proceedings of the Commission II Symposium, Data Integration Techniques, Jul. 13-17, 1998, 8 pages.
McKeown et al., "Chapter 9: Feature Extraction and Object recognition, Automatic Cartographic Feature Extraction Using Photogrammetric Principles," in Digital Photogrammetry: an Addendum to the Manual of Photogrammetry, Greve, C., (ed.), Bethesda, Maryland, American Society for Photogrammetry and Remote Sensing, 1996, 19 pages.

Noronha et al., "Detection and Modeling of Buildings from Multiple Aerial Images," *IEEE Transactions on Pattern Analysis and Machine Intelligence* 23(5):2-32, May 2001.
Perlant et al., "Scene Registration in Aerial Image Analysis," *Photogrammetric Engineering and Remote Sensing* 56(4):481-493, Apr. 1990.
Pershing et al., Petition for Inter Partes Review of U.S. Pat. No. 8,170,840, issued May 1, 2012, "Pitch Determination Systems and Methods for Aerial Roof Estimation," dated Feb. 8, 2016, 67 pages.
Pershing et al., Petition for Inter Partes Review of U.S. Pat. No. 9,129,376, issued Sep. 8, 2015, "Pitch Determination Systems and Methods for Aerial Roof Estimation," dated Feb. 8, 2016, 67 pages.
Pershing et al., Petition for Inter Partes Review of U.S. Pat. No. 8,818,770, issued Sep. 8, 2015, "Pitch Determination Systems and Methods for Aerial Roof Estimation," dated Feb. 8, 2016, 64 pages.
Pershing et al., Petition for Inter Partes Review of U.S. Pat. No. 8,078,436, issued Dec. 13, 2011, "Aerial Roof Estimation Systems and Methods," dated Feb. 8, 2016, 66 pages.
Pictometry, "Electronic Field Study™ User Guide," Version 2.7, Jul. 2007, 537 pages.
European Search Report regarding European Application No. 10162199.3 dated Mar. 14, 2017.
Cory, J., "Aerial Roof Estimating Fast and Accurate," May 5, 2009 (May 5, 2009), Replacement Contractor Online, retrieved from: http://www.replacementcontractoronline.com/on-the-job/roofing/aerial-roof-estimating-fast-and-accurate_o [retrieved on Mar. 1, 2017].
USPTO Patent Trial and Appeal Board, Final Written Decision regarding inter partes review of U.S. Pat. No. 8,818,770; IPR2016-00590, Paper 41; Entered Aug. 14, 2017.
Kugler, Markman Order from *Eagle View Technologies, Inc., and Pictometry International Corp.* v. *Xactware Solutions, Inc., and Verisk Analytics, Inc.*, in the United States District Court District of New Jersey, case No. njd-1-15-cv-07025-RBK-JS, Dated Dec. 5, 2017.
Canadian Intellectual Property Office, Official Action regarding Canadian Patent Application 2,950,725, dated Oct. 12, 2017.
IP Australia, Examination Report regarding Australian Patent Application No. 2016204648, dated Aug. 18, 2017.
USPTO Patent Trial and Appeal Board, Final Written Decision regarding inter partes review of U.S. Pat. No. 8,825,454; IPR2016-00589, Paper 43; Entered Aug. 14, 2017.
USPTO Patent Trial and Appeal Board, Final Written Decision regarding inter partes review of U.S. Pat. No. 8,209,152; IPR2016-00591, Paper 52; Entered Aug. 14, 2017.
IP Australia, Examination Report No. 1 regarding Australian Patent App. No. 2018217240 dated May 29, 2019.
Eagle View Technologies, Inc., Response to Office Action regarding Canadian Patent Application No. 2,950,725 filed with Canadian Intellectual Property Office, dated Apr. 12, 2019.
European Patent Office, Examination Report regarding European Patent Application No. 10162199.3 dated Mar. 28, 2019.

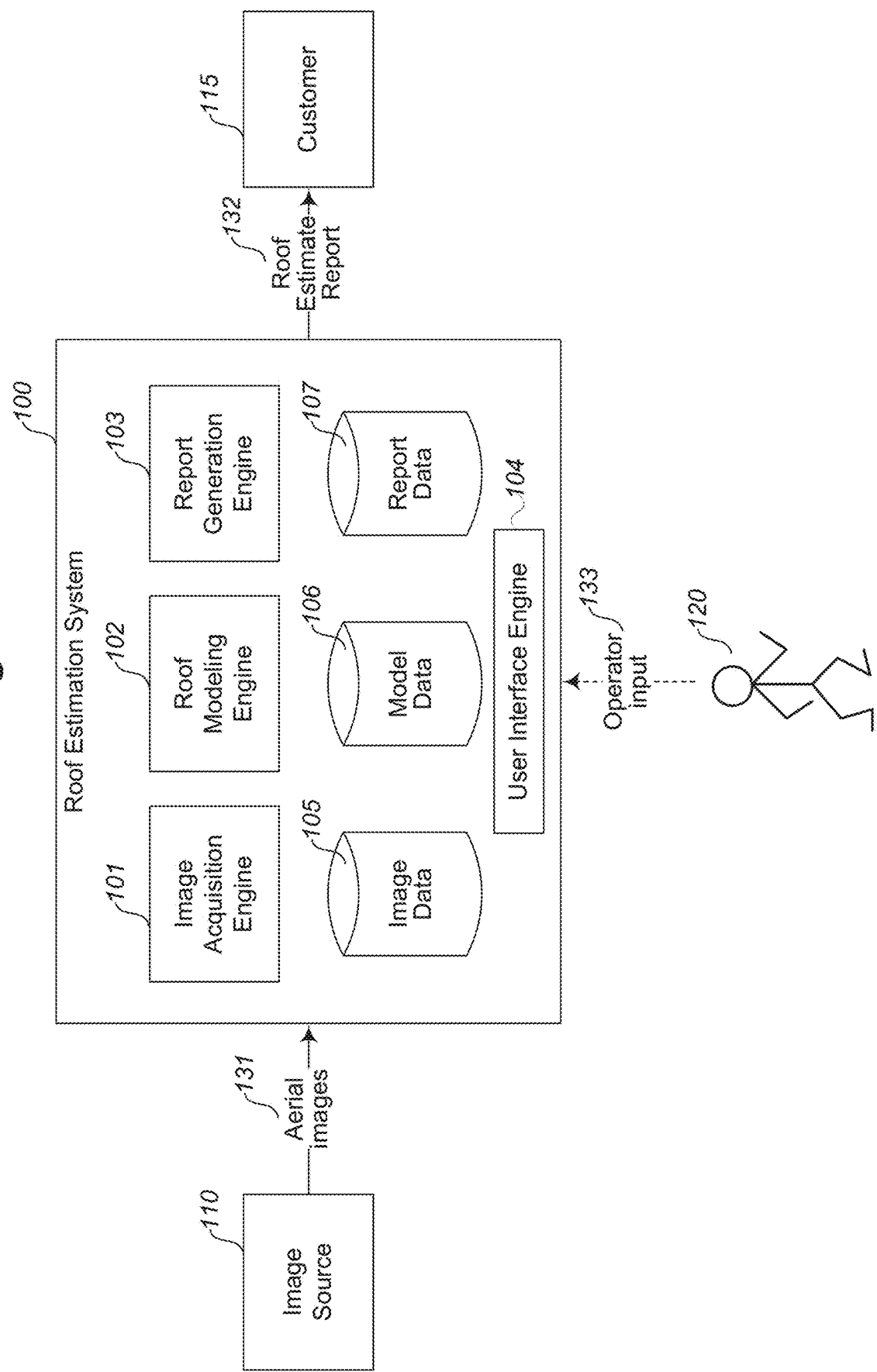

1234 Main Street, Redmond, WA

Order: 2468

<Customer Name Here>

4/16/2008

1234 Main Street, Redmond, WA

Order: 2468   Copyright (c) 2008 Eagle View Technologies, Inc.   Page 1 of 6

PITCH DETERMINATION SYSTEMS AND METHODS FOR AERIAL ROOF ESTIMATION

CROSS REFERENCE TO RELATED APPLICATIONS

This application is a continuation of and claims priority to U.S. patent application Ser. No. 15/832,363, filed Dec. 5, 2017, which is a continuation of U.S. patent application Ser. No. 14/841,523, filed Aug. 31, 2015, which is a continuation of U.S. patent application Ser. No. 14/449,045, filed Jul. 31, 2014, which issued as U.S. Pat. No. 9,129,376; which is a continuation of U.S. patent application Ser. No. 13/438,288, filed Apr. 3, 2012, which issued as U.S. Pat. No. 8,818,770; which is a continuation of U.S. patent application Ser. No. 12/467,244, filed May 15, 2009, which issued as U.S. Pat. No. 8,170,840; which claims benefit of U.S. Provisional Application No. 61/197,904 filed on Oct. 31, 2008, all of which are incorporated herein by reference in their entirety.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field of the Invention

This invention relates to systems and methods for estimating construction projects, and more particularly, to such systems and methods for determining roof measurement information based on one or more aerial images of a roof of a building.

2. Description of the Related Art

The information provided below is not admitted to be part of the present invention, but is provided solely to assist the understanding of the reader.

Homeowners typically ask several roofing contractors to provide written estimates to repair or replace a roof on a house. Heretofore, the homeowners would make an appointment with each roofing contractor to visit the house to determine the style of roof, take measurements, and to inspect the area around the house for access and cleanup. Using this information, the roofing contractor then prepares a written estimate and then timely delivers it to the homeowner. After receiving several estimates from different roofing contractors, the homeowner then selects one.

There are factors that impact a roofing contractor's ability to provide a timely written estimate. One factor is the size of the roof contractor's company and the location of the roofing jobs currently underway. Most roof contractors provide roofing services and estimates to building owners over a large geographical area. Larger roof contractor companies hire one or more trained individuals who travel throughout the entire area providing written estimates. With smaller roofing contractors, the owner or a key trained person is appointed to provide estimates. With both types of companies, roofing estimates are normally scheduled for buildings located in the same area on a particular day. If an estimate is needed suddenly at a distant location, the time for travel and the cost of commuting can be prohibitive. If the roofing contractor is a small company, the removal of the owner or key person on a current job site can be time prohibitive.

Another factor that may impact the roofing contractor's ability to provide a written estimate is weather and traffic.

Recently, solar panels have become popular. In order to install solar panels, the roof's slope, geometrical shape, and size as well as its orientation with respect to the sun all must be determined in order to provide an estimate of the number and type of solar panels required. Unfortunately, not all roofs on a building are proper size, geometrical shape, or orientation for use with solar panels.

SUMMARY

These and other objects are met by the systems and methods disclosed herein that determine and provide roof measurement information about the sizes, dimensions, slopes and orientations of the roof sections of a building roof. Roof measurement information may be used to generate a roof estimate report that provides and graphically shows this information. A roof estimation system that practices at least some of the techniques described herein may include an image acquisition engine, a roof modeling engine, and a report generation engine. The roof estimation system is configured to generate a model of a roof of a building, based on one or more aerial images. In addition, the roof estimation system is configured to determine roof measurement information and generate a roof estimate report based on the generated model and/or the determined roof measurement information.

In some embodiments, the roof estimation system includes a user interface engine which provides access to at least some of the functions of the roof estimation system. In one embodiment, the user interface engine provides interactive user interface components operable by an operator to perform various functions related to generating a model of a roof of a building, including image registration, lean correction, pitch determination, feature identification, and model review and/or correction.

BRIEF DESCRIPTION OF THE DRAWINGS

FIG. 1 is a block diagram illustrating example functional elements of one embodiment of a roof estimation system.

DETAILED DESCRIPTION

Figure 2A:
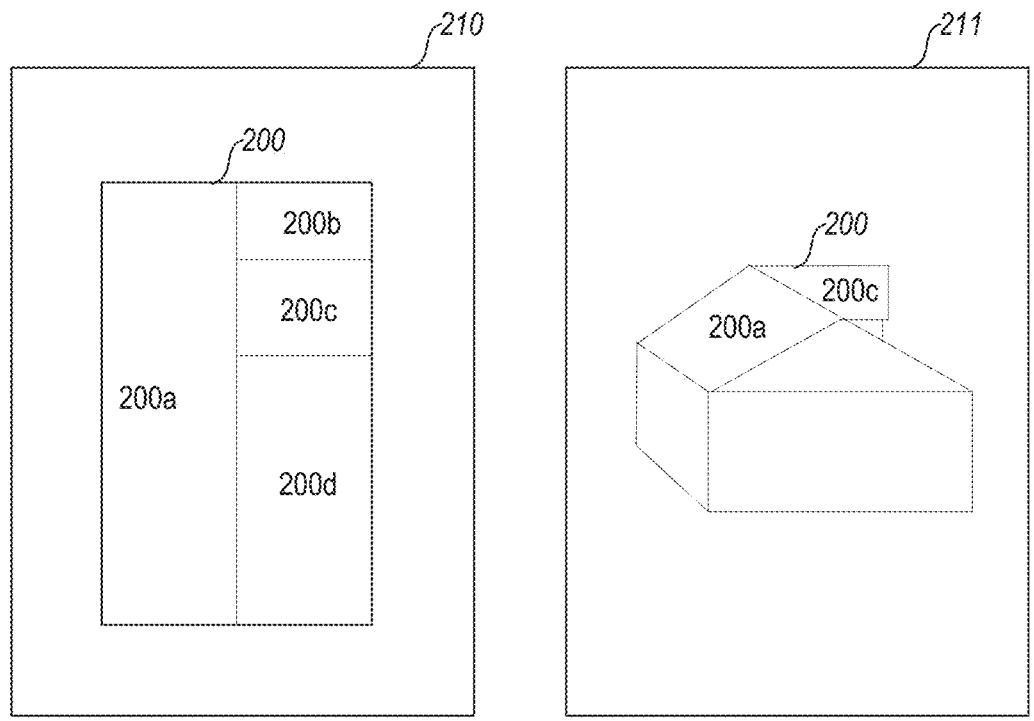
FIGS. 2A-2B illustrate aerial images of a building at a particular address.

Embodiments described herein provide enhanced computer- and network-based methods, techniques, and systems for estimating construction projects based on one or more images of a structure. Example embodiments provide a Roof Estimation System ("RES") that is operable to provide a roof estimate report for a specified building, based on one or more aerial images of the building. In one embodiment, a customer of the RES specifies the building by providing an address of the building. The RES then obtains one or more aerial images showing at least portions of the roof of the building. Next, the RES generates a model of the roof of the building, which is then utilized to determine roof measurement information. The roof measurement information may include measurements such as lengths of the edges of sections of the roof, pitches of sections of the roof, areas of sections of the roof, etc. The model of the roof and/or the roof measurement information is then used to generate a roof estimate report. The roof estimate report includes one or more line drawings of the roof of the building, which are annotated with information about the roof, such as lengths of the edges of sections of the roof, pitches of sections of the roof, areas of sections of the roof, etc.

Some embodiments of the roof estimation system include an interactive user interface configured to provide access to one or more of the functions of the roof estimation system. In one embodiment, the roof estimation system includes user interface controls that facilitate image registration, image lean correction, roof model generation, pitch determination, and roof model review. Image registration includes aligning, based at least in part on operator inputs, one or more images of a building roof to a set of reference points within a single three-dimensional ("3D") grid that is shared between the one or more images. Roof model generation includes generating a 3D model of a roof, based at least in part on operator inputs specifying various features and/or dimensional attributes of the roof. Roof model generation may further include the determination of the pitches of various planar sections of a roof. Roof model review includes display of a model of a roof, possibly in conjunction with one or more images of the roof, so that an operator may review the model for accuracy and possibly make adjustments and/or corrections to the roof model. In other embodiments, all or some of the functions of the roof estimation system may be performed automatically. For example, image registration may include automatically identifying building features for the placement of reference markers. Further, roof model generation may include automatically recognizing features, dimensional attributes, and/or pitches of various planar roof sections of the roof.

The described user interface is also configured to concurrently display roof features onto multiple images of a roof. For example, in the context of roof model generation, an operator may indicate a roof feature, such as an edge or a corner of a section of the roof, in a first image of the roof. As the roof estimation system receives the indication of the roof feature, the user interface concurrently displays that feature in one or more other images of the roof, so that the operator may obtain feedback regarding the accuracy of the roof model, the image registration, etc.

In the following, FIGS. 1-3 provide an overview of the operation of an example roof estimation system. FIGS. 4-7 provide additional details related to an example interactive user interface provided by one embodiment of the roof estimation system. FIGS. 8-11 provide details related to roof estimation system implementation techniques.

1. Roof Estimation System Overview

FIG. 1 is a block diagram illustrating example functional elements of one embodiment of a roof estimation system. In particular, FIG. 1 shows an example Roof Estimation System ("RES") 100 comprising an image acquisition engine 101, a roof modeling engine 102, a report generation engine 103, image data 105, model data 106, and report data 107. The RES 100 is communicatively coupled to an image source 110, a customer 115, and optionally an operator 120. The RES 100 and its components may be implemented as part of a computing system, as will be further described with reference to FIG. 8.

More specifically, in the illustrated embodiment of FIG. 1, the RES 100 is configured to generate a roof estimate report 132 for a specified building, based on aerial images 131 of the building received from the image source 110. The image source 110 may be any provider of images of the building for which a roof estimate is being generated. In one embodiment, the image source 110 includes a computing system that provides access to a repository of aerial images of one or more buildings. In addition, the aerial images 131 may include images obtained via manned or unmanned aircraft (e.g., airplane, helicopter, blimp, drone, etc.), satellite, etc. Furthermore, the aerial images 131 may include images obtained via one or more ground-based platforms, such as a vehicle-mounted camera that obtains street-level images of buildings, a nearby building, a hilltop, etc. In some cases, a vehicle-mounted camera may be mounted in an elevated position, such as a boom. Example aerial images are described further with reference to FIGS. 2A-2B.

The image acquisition engine 101 obtains one or more aerial images of the specified building by, for example, providing an indicator of the location of the specified building (e.g., street address, GPS coordinates, lot number, etc.) to the image source 110. In response, the image source 110 provides to the image acquisition engine 101 the one or more aerial images of the building. The image acquisition engine 101 then stores the received aerial images as image data 105, for further processing by other components of the RES 100. Obtaining aerial images of a specified building may include various forms of geo-coding, performed by the image acquisition engine 101 and/or the image source 110. In one embodiment, the image source geo-codes a provided street address into latitude and longitude coordinates, which are then used to look up (e.g., query a database) aerial images of the provided street address.

Next, the roof modeling engine 102 generates a model of the roof of the specified building. In the illustrated embodiment, the roof modeling engine 102 generates a three-dimensional ("3D") model, although in other embodiments, a two-dimensional (e.g., top-down roof plan) may be generated instead or in addition. Generating a model of the roof may generally include image calibration, in which the distance between two pixels on a given image is converted into a physical length. Image calibration may be performed automatically, such as based on meta-information provided along with the aerial images 131.

A variety of automatic and semi-automatic techniques may be employed to generate a model of the roof of the building. In one embodiment, generating such a model is based at least in part on a correlation between at least two of the aerial images of the building. For example, the roof modeling engine 102 receives an indication of a corresponding feature that is shown in each of the two aerial images. In one embodiment, an operator 120, viewing two or more images of the building, inputs an indication in at least some of the images, the indications identifying which points of the images correspond to each other for model generation purposes.

The corresponding feature may be, for example, a vertex of the roof of the building, the corner of one of the roof planes of the roof, a point of a gable or hip of the roof, etc. The corresponding feature may also be a linear feature, such as a ridge or valley line between two roof planes of the roof. In one embodiment, the indication of a corresponding feature on the building includes "registration" of a first point in a first aerial image, and a second point in a second aerial image, the first and second points corresponding substantially to the same point on the roof of the building. Generally, point registration may include the identification of any feature shown in both aerial images. Thus, the feature need not be a point on the roof of the building. Instead, it may be, for example, any point that is visible on both aerial images, such as on a nearby building (e.g., a garage, neighbor's building, etc.), on a nearby structure (e.g., swimming pool, tennis court, etc.), on a nearby natural feature (e.g., a tree, boulder, etc.), etc.

In some embodiments, the roof modeling engine 102 determines the corresponding feature automatically, such as by employing on one or more image processing techniques used to identify vertexes, edges, or other features of the roof. In other embodiments, the roof modeling engine 102 determines the corresponding feature by receiving, from the human operator 120 as operator input 133, indications of the feature shown in multiple images of the building.

In one example embodiment, the RES 100 generates a model of the roof of the building in the following manner. First, a set of reference points are be identified in each of the images. These reference points are identified by the operator 120 utilizing a suitable input device, such as a mouse or joystick. The roof modeling engine 102 then uses these reference points and any acceptable algorithm to co-register the images and reconstruct the three-dimensional geometry of the object identified by the reference points. There are a variety of photogrammetric algorithms that can be utilized to perform this reconstruction. One such algorithm used by the RES 100 uses photographs taken from two or more view points to "triangulate" points of interest on the object in three-dimensional ("3D") space. This triangulation can be visualized as a process of projecting a line originating from the location of the photograph's observation point that passes through a particular reference point in the image. The intersection of these projected lines from the set of observation points to a particular reference point identifies the location of that point in 3D space. Repeating the process for all such reference points allows the software to determine a 3D volume suitable for building a 3D model of the structure. The choice of reconstruction algorithm depends on a number of factors such as the spatial relationships between the photographs, the number and locations of the reference points, and any assumptions that are made about the geometry and symmetry of the object being reconstructed. Several such algorithms are described in detail in textbooks, trade journals, and academic publications.

In addition, generating a model of the roof of a building may include correcting one or more of the aerial images for various imperfections. For example, the vertical axis of a particular aerial image sometimes will not substantially match the actual vertical axis of its scene. This will happen, for example, if the aerial images were taken at different distances from the building, or at a different pitch, roll, or yaw angles of the aircraft from which the images were produced. In such cases, an aerial image may be corrected by providing the operator 120 with a user interface control operable to adjust the scale and/or relative angle of the aerial image to correct for such errors. The correction may be either applied directly to the aerial image, or instead be stored (e.g., as an offset) for use in model generation or other functions of the RES 100.

Generating a model of the roof of a building further includes the automatic or semi-automatic identification of features of the roof of the building. In one embodiment, one or more user interface controls may be provided, such that the operator 120 may indicate (e.g., draw, paint, etc.) various features of the roof, such as valleys, ridges, hips, vertexes, planes, edges, etc. As these features are indicated by the operator 120, a corresponding three-dimensional ("3D") model may be updated accordingly to include those features. These features are identified by the operator based on a visual inspection of the images and by providing inputs that identify various features as valleys, ridges, hips, etc. In some cases, a first and a second image view of the roof (e.g., a north and east view) are simultaneously presented to the operator 120, such that when the operator 120 indicates a feature in the first image view, a projection of that feature is automatically presented in the second image view. By presenting a view of the 3D model, simultaneously projected into multiple image views, the operator 120 is provided with useful visual cues as to the correctness of the 3D model and/or the correspondence between the aerial images.

In addition, generating a model of the roof of a building may include determining the pitch of one or more of the sections of the roof. In some embodiments, one or more user interface controls are provided, such that the operator 120 may accurately determine the pitch of each of the one or more roof sections. An accurate determination of the roof pitch may be employed (by a human or the RES 100) to better determine an accurate cost estimate, as roof sections having a low pitch are typically less costly surfaces to repair and/or replace.

The generated model typically includes a plurality of planar roof sections that each correspond to one of the planar sections of the roof of the building. Each of the planar roof sections in the model has a number of associated dimensions and/or attributes, among them slope, area, and length of each edge of the roof section. Other information may include any information relevant to a roof builder or other entity having an interest in construction of, or installation upon, the roof. For example, the other information may include identification of valleys, ridges, rakes, eaves, or hip ridges of the roof and/or its sections; roof and/or roof section perimeter dimensions and/or outlines; measurements of step heights between different roof levels (e.g., terraces); bearing and/or orientation of each roof section; light exposure and/or shadowing patterns due to chimneys, other structures, trees, latitude, etc.; roofing material; etc? Once a 3D model has been generated to the satisfaction of the roof modeling engine 102 and/or the operator 120, the generated 3D model is stored as model data 106 for further processing by the RES 100. In one embodiment, the generated 3D model is then stored in a quality assurance queue, from which it is reviewed and possibly corrected by a quality control operator.

The report generation engine 103 generates a final roof estimate report based on a model stored as model data 106, and then stores the generated report as report data 107. Such a report typically includes one or more plan (top-down) views of the model, annotated with numerical values for the slope, area, and/or lengths of the edges of at least some of the plurality of planar roof sections of the model of the roof. The report may also include information about total area of the roof, identification and measurement of ridges and/or valleys of the roof, and/or different elevation views rendered from the 3D model (top, side, front, etc). An example report is illustrated and discussed with respect to FIGS. 3A-3E, below.

In some embodiments, generating a report includes labeling one or more views of the model with annotations that are readable to a human user. Some models include a large number of small roof details, such as dormers or other sections, such that applying uniformly sized, oriented, and positioned labels to roof section views results in a visually cluttered diagram. Accordingly, various techniques may be employed to generate a readable report, including automatically determining an optimal or near-optimal label font size, label position, and/or label orientation, such that the resulting report may be easily read and understood by the customer 115.

In addition, in some embodiments, generating a report includes automatically determining a cost estimate, based on specified costs, such as those of materials, labor, transportation, etc. For example, the customer 115 provides indications of material and labor costs to the RES 100. In response, the report generation engine 103 generates a roof estimate report that includes a cost estimate, based on the costs provided by the customer 115 and the attributes of the particular roof, such as area, pitch, etc.

In one embodiment, the generated report is then provided to a customer. The generated report can be represented, for example, as an electronic file (e.g., a PDF file) or a paper document. In the illustrated example, roof estimate report 132 is transmitted to the customer 115. The customer 115 may be or include any human, organization, or computing system that is the recipient of the roof estimate report 132. For example, the customer 115 may be a property owner, a property manager, a roof construction/repair company, a general contractor, an insurance company, a solar power panel installer, a climate control (e.g., heating, ventilation, and/or air conditioning) system installer, a roof gutter installer, an awning installer, etc. Reports may be transmitted electronically, such as via a network (e.g., as an email, Web page, etc.) or by some shipping mechanism, such as the postal service, a courier service, etc.

In some embodiments, one or more of the models stored as model data 106 are provided directly to the customer or other computing system, without first being transformed into a report. For example, a model and/or roof measurement information based thereon may be exported and/or transmitted as a data file, in any suitable format, that may be consumed or otherwise utilized by some other computing system, such as a computer-aided design ("CAD") tool, a drawing program, a labor and material estimation software, a project management/estimation software, etc.

The RES 100 may be operated by various types of entities. In one embodiment, the RES 100 is operated by a roof estimation service that provides roof estimate reports to customers, such as roofing contractors, in exchange for payment. In another embodiment, the RES 100 is operated by a roof construction/repair company, to generate roof estimate reports that are used internally and/or provided to customers, such as property owners.

In addition, the RES 100 may be operated in various ways. In one embodiment, the RES 100 executes as a desktop computer application that is operated by the operator 120. In another embodiment, the RES 100 executes as a network-accessible service, such as by a Web server, that may be operated remotely by the operator 120 and/or the customer 115. Additional details regarding the implementation of an example roof estimation system are provided with respect to FIG. 8, below.

Figure 2B:
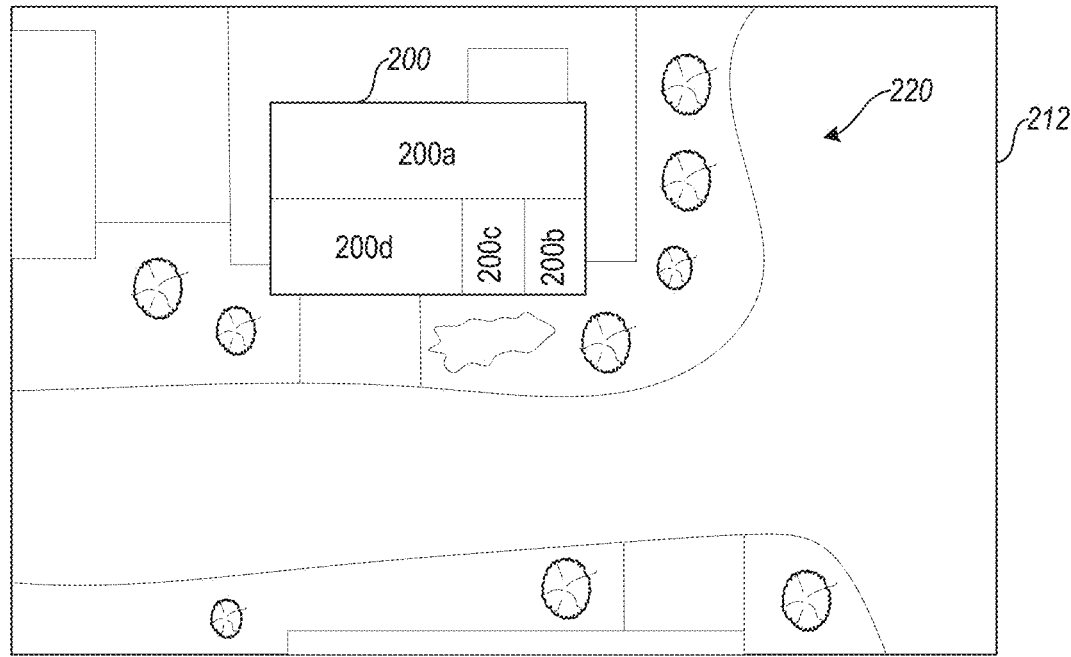

FIGS. 2A-2B illustrate aerial images of a building at a particular address. In the illustrated example, the aerial images are represented as stylized line drawings for clarity of explanation. As noted above, such aerial images may be acquired in various ways. In one embodiment, an aircraft, such as an airplane or helicopter is utilized to take photographs while flying over one or more properties. Such aircraft may be manned or unmanned. In another embodiment, a ground-based vehicle, such as a car or truck, is utilized to take photographs (e.g., "street view" photographs) while driving past one or more properties. In such an embodiment, a camera may be mounted on a boom or other elevating member, such that images of building roofs may be obtained. In another embodiment, photographs may be taken from a fixed position, such as a tall building, hilltop, tower, etc.

In particular, FIG. 2A shows a top plan (top-down) aerial image 210 of a building 200. The roof of the building 200 includes multiple planar roof sections 200a-200d. FIG. 2A also shows a second aerial image 211 providing a perspective (oblique) view of the building 200. The roof sections 200a and 200c are also visible in image 211.

FIG. 2B shows a top-down, wide angle image 212 of the building 200. The image 212 includes details of the surrounding areas 220 of the building 220. Information about the surrounding areas 220 of the building 220 are in some embodiments used to determine additional cost factors related to a roof estimate. For example, the cleanup of, or access to, a worksite at building 220 may be complicated by various factors, including a substantial amount of landscaping; steeply sloped building sites; proximity to environmentally sensitive areas; etc. In such cases, the roof estimation system may automatically increase a cost factor in a corresponding roof estimate report.

In some embodiments, an aerial image has corresponding meta-information. Such meta-information may include details about the type of camera used (e.g., focal length, exposure, etc.), the position of the camera (e.g., GPS coordinates of the aircraft at the time the image was captured), the orientation of the camera (e.g., the angle of the camera), the time and/or date the image was captured, etc.

FIGS. 3A-3F illustrate individual pages of an example roof estimate report generated by an example embodiment of a roof estimation system. As discussed with respect to FIG. 1, a roof estimate report is generated by the roof estimation system based on one or more aerial images of a building. The roof estimate report may be based on a computer model (e.g., a 3D model) of the roof, and includes one or more views of the model. In this example, the various views of the model are presented as annotated line drawings, which provide information about the roof, such as the roof section areas, roof section edge lengths, roof section pitches, etc. The roof estimate report may be in an electronic format (e.g., a PDF file) and/or paper format (e.g., a printed report). In some embodiments, the roof estimate report may be in a format that may be consumed by a computer-aided design program.

Figure 3A:
FIGS. 3A-3F illustrate individual pages of an example roof estimate report generated by an example embodiment of a roof estimation system.

FIG. 3A shows a cover page 301 of the report and includes the address 301a of a building 301c and an overhead aerial image 301b of the building 301c.

Figure 3B:
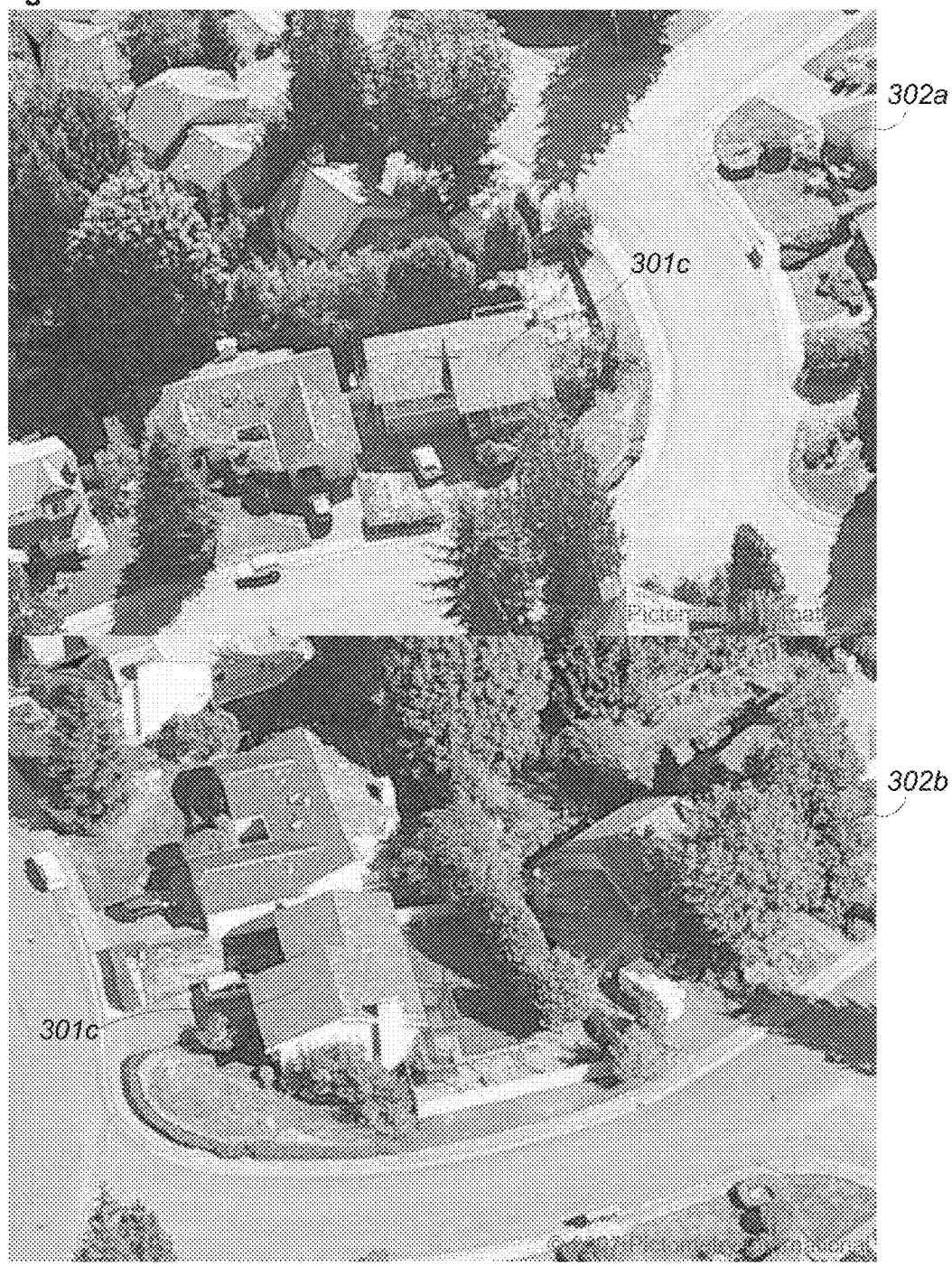

FIG. 3B shows a second page 302 of the report and includes two wide perspective (oblique) views 302a and 302b of the building 301c at the address with the surrounding areas more clearly shown.

Figure 3C:
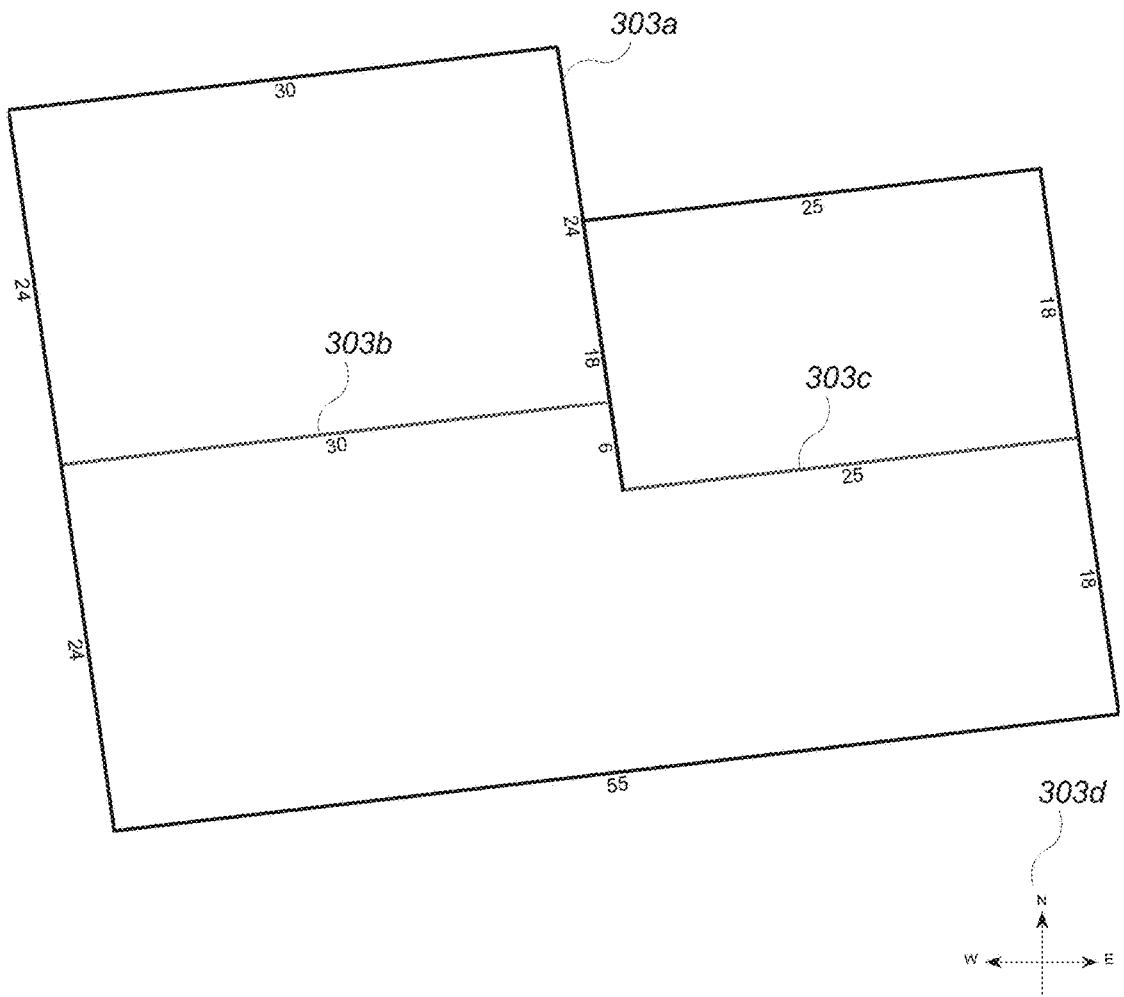

FIG. 3C shows a third page 303 of the report and includes a line drawing 303a of the building roof showing ridge lines 303b and 303c, and a compass indicator 303d. In addition, a building roof having valleys would result in a line drawing including one or more valley lines. The ridge and/or valley lines may be called out in particular colors. For example, ridge lines 303b and 303c may be illustrated in red, while valley lines may be illustrated in blue. The line drawing 303a is also annotated with the dimensions of the planar sections of the building roof. In this case, the dimensions are the lengths of the edges of the planar roof sections.

Figure 3D:
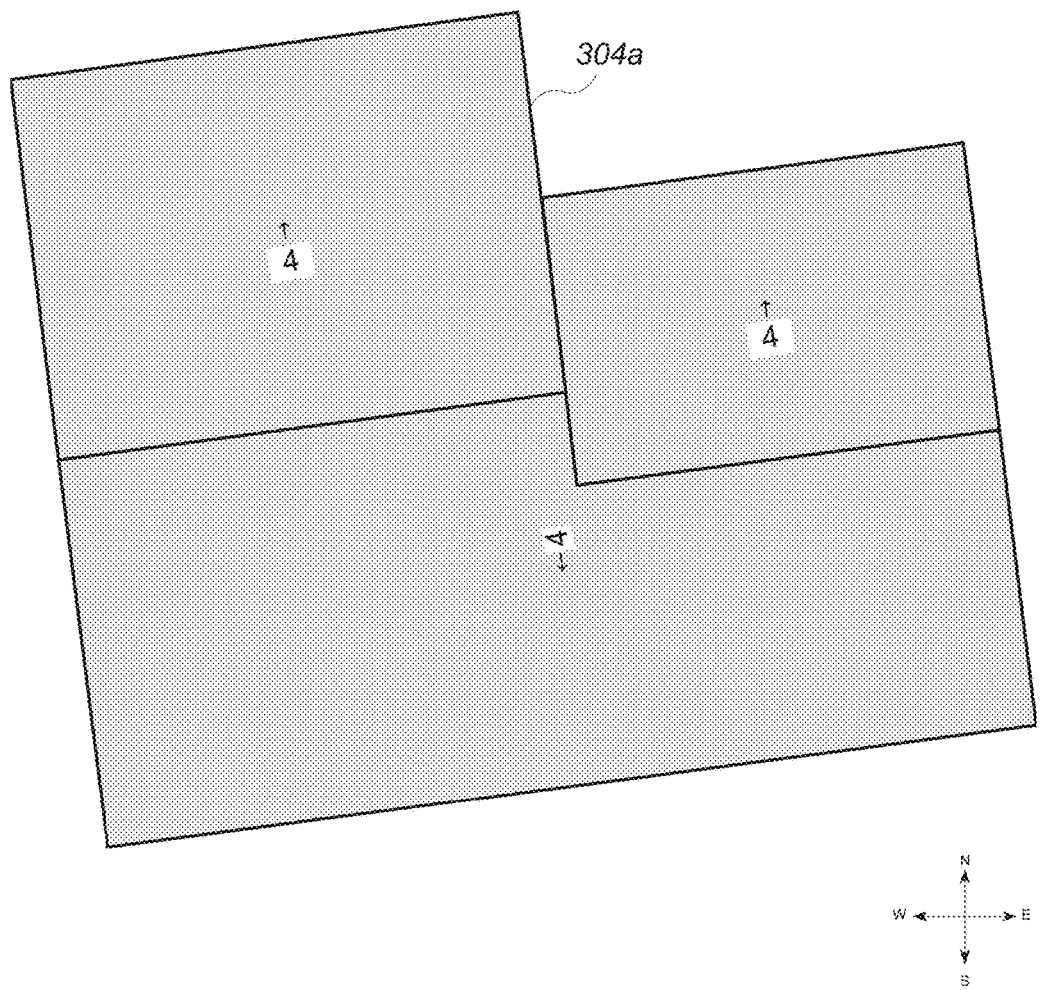

FIG. 3D shows a fourth page 304 of the report and includes a line drawing 304a of the building roof showing the pitch of each roof section along with a compass indicator. The pitch in this example is given in inches, and it represents the number of vertical inches that the labeled planar roof section drops over 12 inches of horizontal run. The slope can be easily calculated from such a representation using basic trigonometry. The use of a numerical value of inches of rise per foot of run is a well known measure of slope in the roofing industry. A roof builder typically uses this information to assist in the repair and/or construction of a roof. Of course, other measures and/or units of slope may be utilized as well, including percent grade, angle in degrees, etc.

Figure 3E:
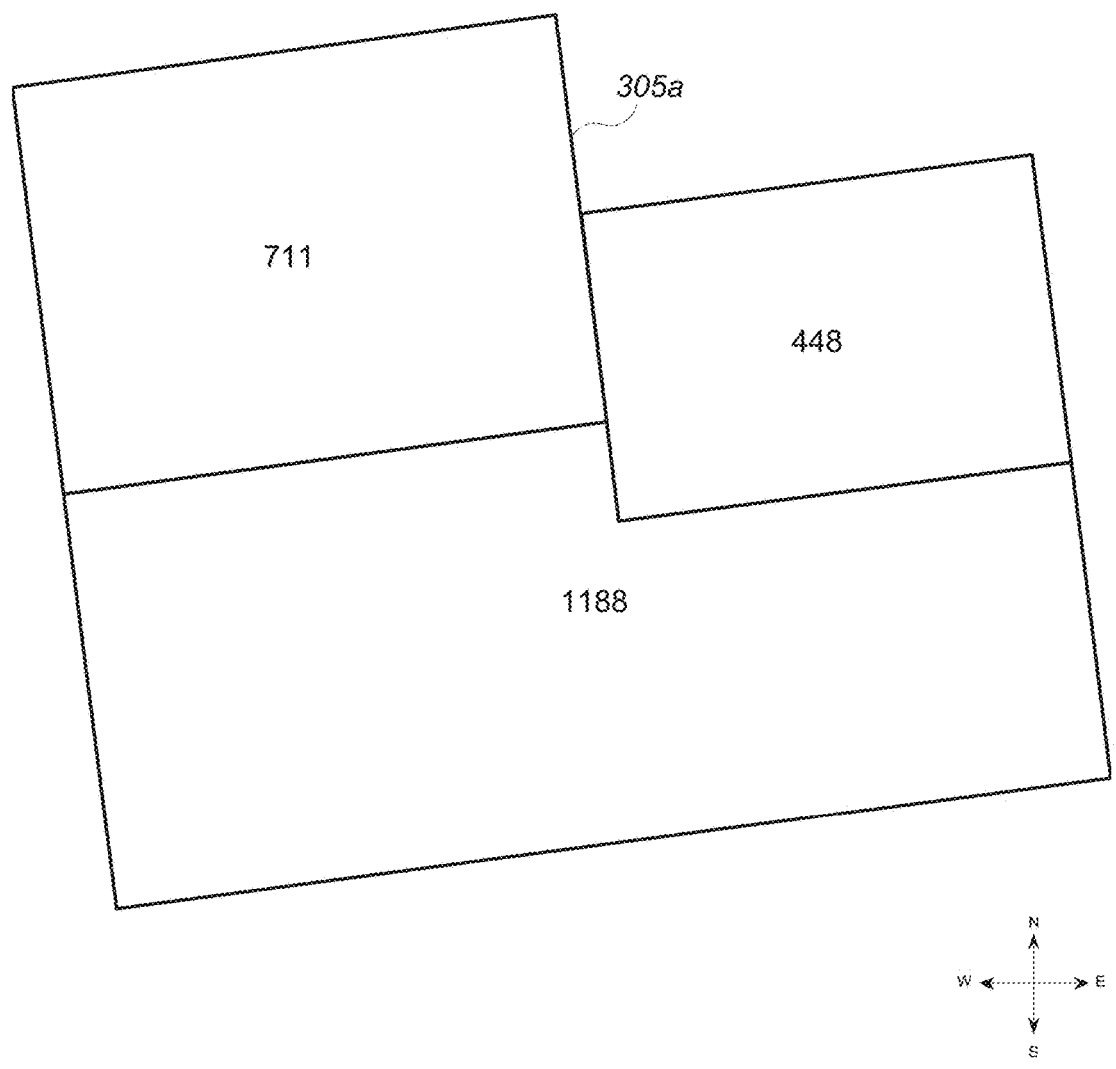

FIG. 3E shows a fifth page 305 of the report and includes a line drawing 305a of the building roof showing the square footage of each roof section along with the total square foot area value. Of course, other units of area may be used as well, such as square meters or the number of "squares" of roofing material required for covering each roof section.

Figure 3F:
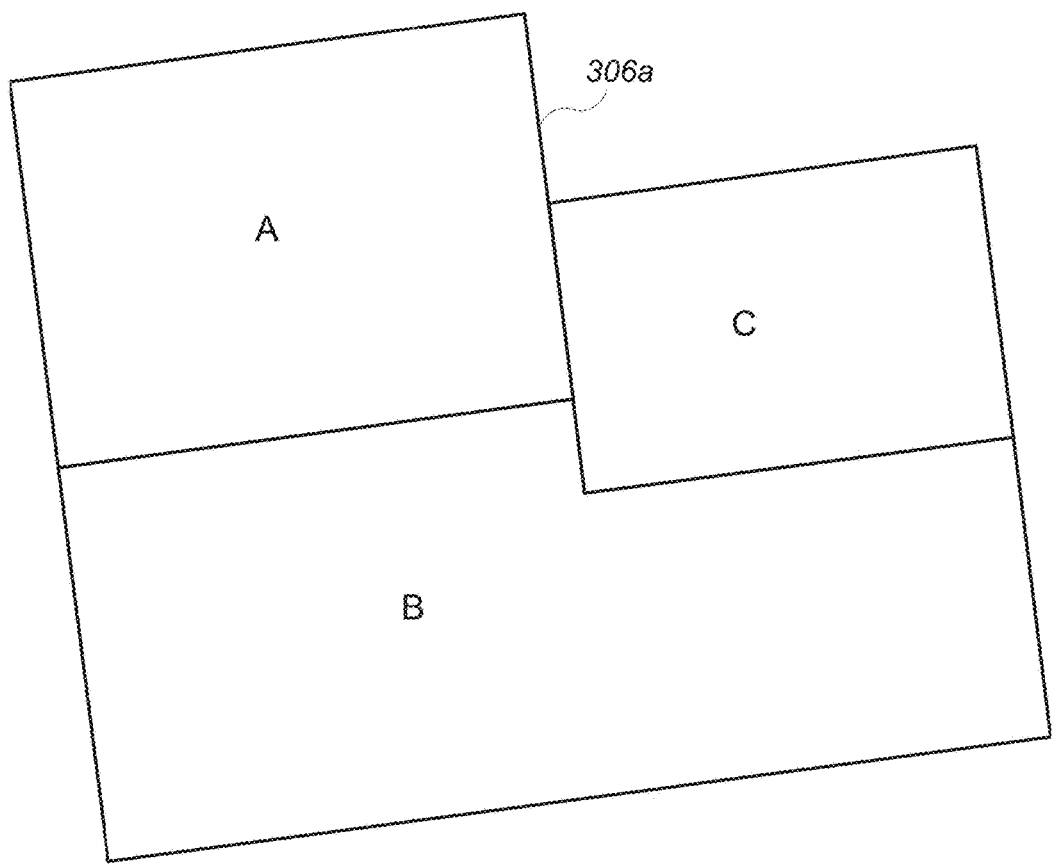

FIG. 3F shows a fifth page 306 of the report and includes a line drawing 306a of the building roof where notes or comments may be written. The line drawing 306a includes a label for each roof section (shown here as "A", "B", "C"), such that comments may be conveniently related to specific roof sections.

In other embodiments, more or less information may be provided, or the illustrated information may be arranged in different ways. For example, the report may be provided in electronic form, such as a PDF file or a computer aided design software format. In some embodiments, the report may be "active" or editable, such that the user of the report may make changes to the report, based on on-site observations.

2. Roof Estimation System User Interface

FIGS. 4A-4F, 5A-5D, 6A-6D, and 7A-7C describe an example interactive user interface provided by one embodiment of the roof estimation system. As noted, the RES 100 described with reference to FIG. 1 includes a user interface engine 104 that is configured to provide access to one or more functions of the RES 100, including image registration (described with respect to FIGS. 4A-4F), roof pitch determination (described with respect to FIGS. 5A-5D), roof model construction (described with reference to FIGS. 6A-6D), and roof model review (described with respect to FIGS. 7A-7C).

A. Image Registration

Figure 4A:
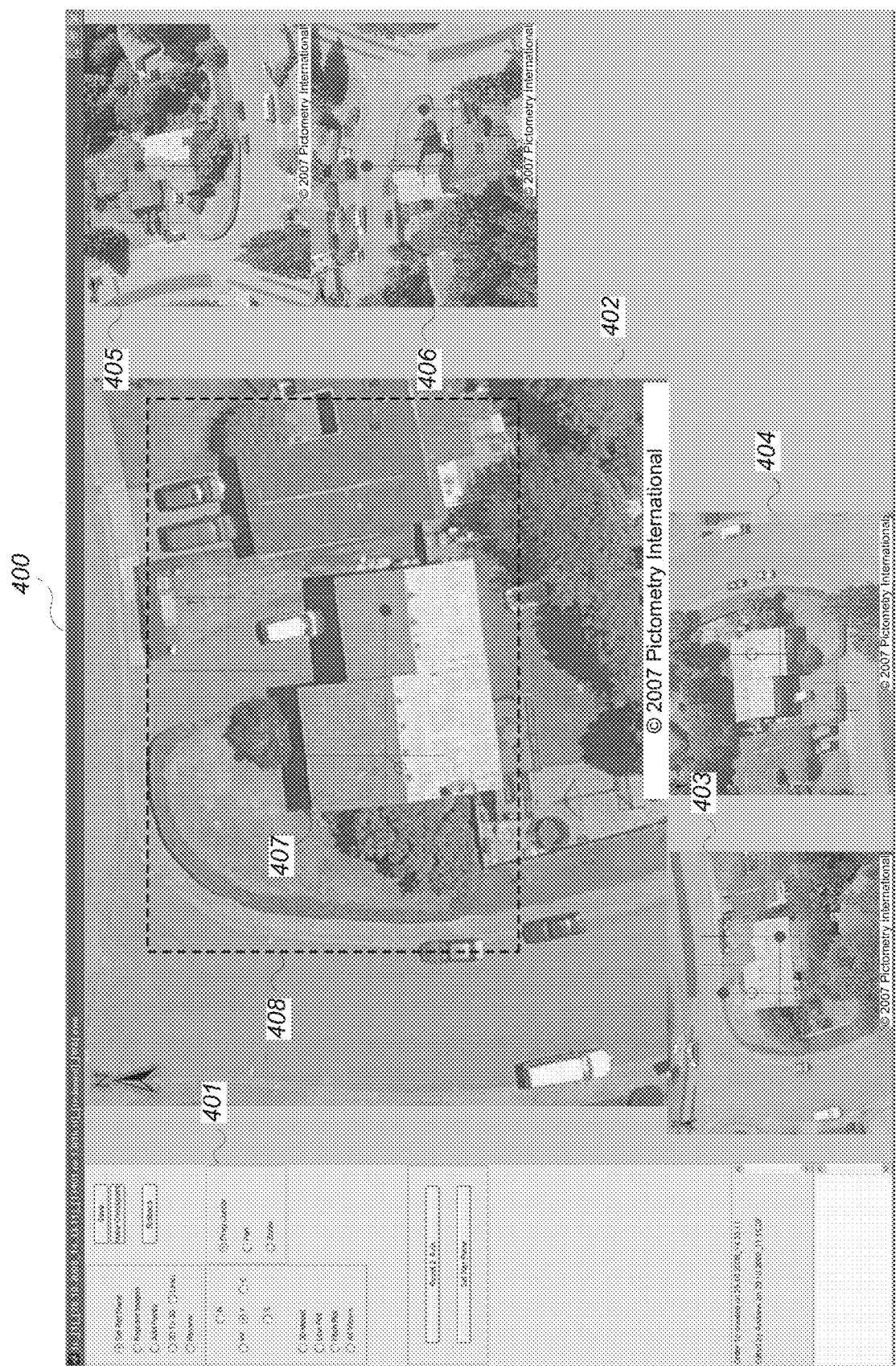
FIGS. 4A-4F are screen displays illustrating image registration and image lean correction in an example embodiment. (Also shows lean correction.)

FIGS. 4A-4F are screen displays illustrating image registration and image lean correction in an example embodiment. In particular, FIG. 4A shows a user interface screen 400 that is utilized by an operator to generate a three dimensional model of a roof of a building. The user interface screen 400 shows a roof modeling project in an initial state, after the operator has specified an address of a building and after images of the building have been obtained and loaded into the roof estimation system.

The user interface screen 400 includes a control panel 401 and five images 402-406 of a building roof 407. The control panel 401 includes user selectable controls (e.g., buttons, check boxes, menus, etc.) for various roof modeling tasks, such as setting reference points for the images, setting the vertical (Z) axis for the images, switching between different images, saving the model, and the like. Each of the images 402-406 provides a different view of the building roof 407. In particular, images 402-406 respectively provide substantially top-down, south, north, west, and east views of the building roof 407. Each image 402-406 includes four marker controls (also called "reference points" or "registration markers") that are used by the operator to set reference points in the image for purposes of image registration. The registration markers will be described further with respect to an enlargement of image portion 408 described with respect to FIGS. 4B-4C, below.

Figure 4B:
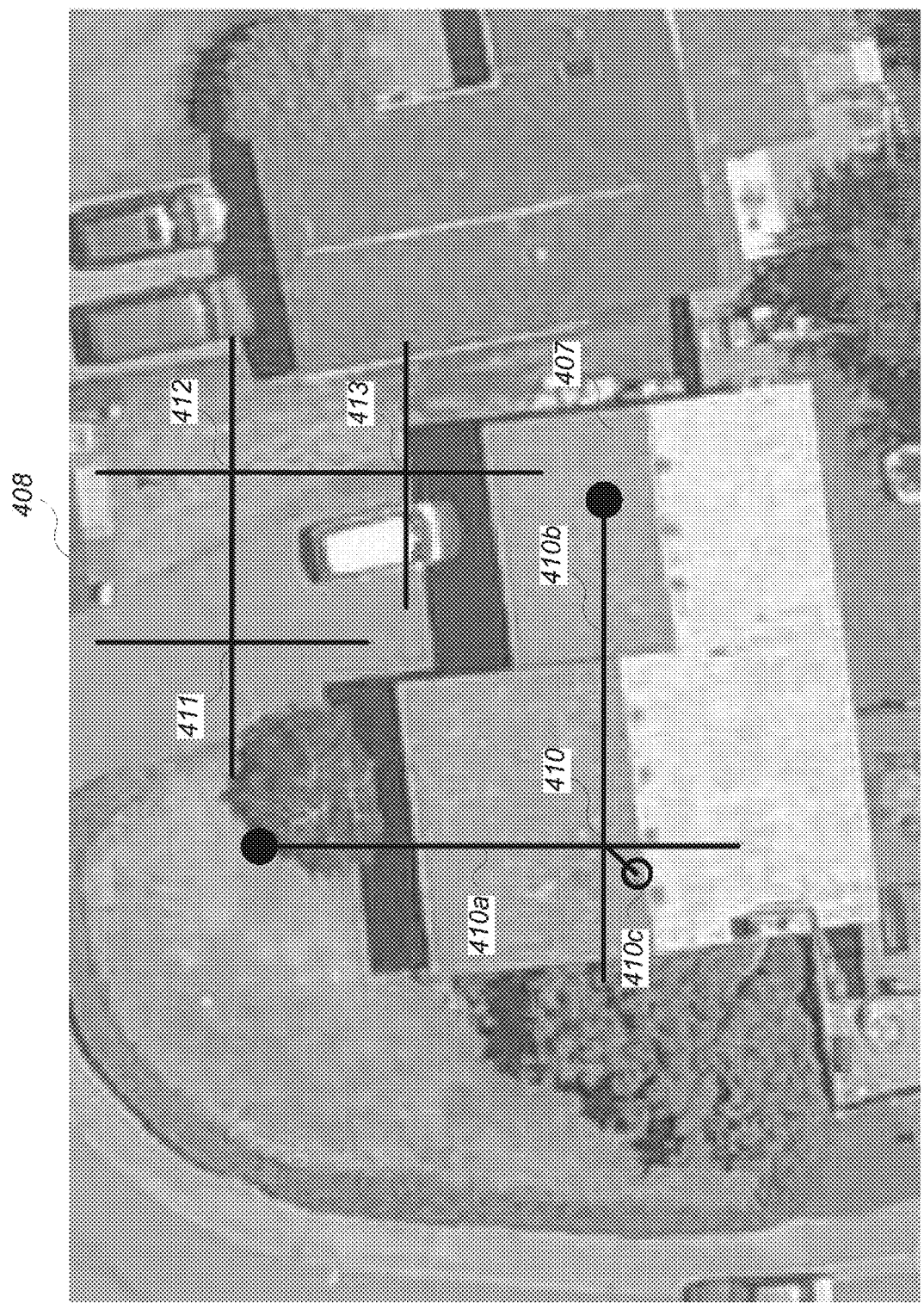
Figure 4C:

FIGS. 4B-4C show an enlarged view of image portion 408 during the process of image registration for image 402, which provides a top-down view of the building roof 407. As shown in FIG. 4B, image portion 408 includes the building roof 407 and registration markers 410-413. The markers 410-413 are interactive user interface controls that can be directly manipulated (e.g., moved, rotated, etc.) by the operator in order to specify points to use for purposes of image registration. In particular, image registration includes determining a transformation between each of one or more images and a uniform 3D reference grid. The uniform 3D reference grid is used as a coordinate system for a 3D model of the roof. By registering multiple images to the reference grid, an operator may indicate a roof feature on an image (such as a roof edge), which may then be translated from the coordinate system of the image to the coordinate system of the reference grid, for purposes of including of the indicated feature in the 3D model.

Marker 410 is an origin marker control, and includes arms 410a-410c. Arms 410a and 410b are horizontal arms that are utilized to specify the X and Y axes (e.g., the horizontal plane) of the reference grid. Arm 410c is a vertical arm that may be utilized to specify the Z axis (e.g., the vertical axis) of the reference grid. The use of the vertical arm to specify the Z axis will be further described with respect to FIG. 4E, below.

Typically, markers 410-413 are color coded, such that they may be distinguished from one another. For example, marker 411-413 may be respectively colored red, blue, and green. Origin marker 410 has a different appearance than markers 411-413, so may be of any color. In other embodiments, markers 411-413 may be distinguished in other ways, such as by utilizing different sized dashed lines, different line thicknesses, etc. In still other embodiments, markers are not distinguished any way from each other, such as by being of uniform shape, color, etc.

FIG. 4C shows image portion 408 with markers 410-413 after they have been placed by an operator. Typically, registration markers are placed at four spatially distributed corners of the roof. As shown in FIG. 4C, the operator has placed markers 410-413 at four different corners of the building roof 407. In particular, the operator first placed the origin marker 410 at the lower left corner of the building roof 407, and has adjusted (e.g., rotated) the arms 410a and 410b to align with the major horizontal axes of the roof. By adjusting the arms 410a and 410b of the origin marker 410, the rotational orientation of markers 411-413 is automatically adjusted by the roof estimation system. Next, the operator places markers 411-413 on some other corners of the roof. In general, the operator can place registration marker over any roof feature, but roof corners are typically utilized because they are more easily identified by the operator. After the operator is satisfied with the placement of markers 410-413, the operator typically registers a next image of the building roof 407, as will be described next.

Figure 4D:
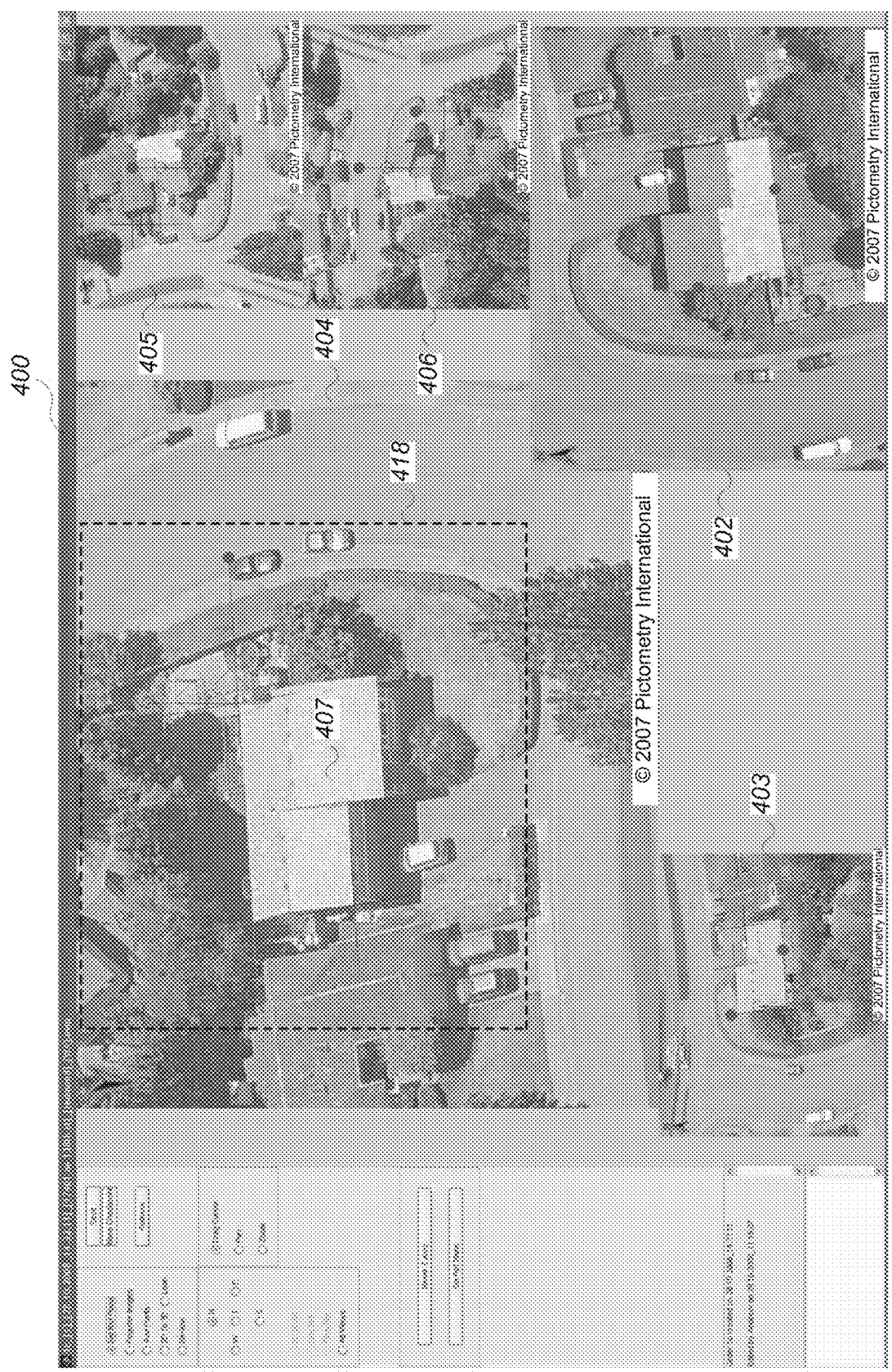
Figure 4E:
Figure 4F:

FIGS. 4D-4F illustrate image registration for image 404, which provides a north view of the building roof 407. In particular, FIG. 4D shows the user interface screen 400 described with reference to FIG. 4A. Here, image 402 has been minimized, while image 404 has been enlarged so that the operator may register that image by placing markers on image 404, as will be described below with respect to an enlarged view of image portion 418.

FIG. 4E shows an enlarged view of image portion 418 during the process of image registration for image 404. Image portion 418 includes the building roof 407 and registration markers 420-423. Markers 420-423 respectively correspond to markers 410-413 described above. In particular, marker 420 is an origin marker control that includes arms 420a-420c. Arms 420a and 420b are horizontal arms that are utilized to specify the X and Y axes of the reference grid. Arm 420c is a vertical arm that may be utilized to specify the Z axis of the reference grid.

In the example of FIG. 4E, the operator has moved each of markers 420-423 to a corner of the roof 407. Note that the markers 420-423 are moved to roof corners that correspond to those selected by the operator with markers 410-413, as described with reference to FIG. 4C. In particular, origin marker 420 has been moved to the corner of the roof 407 selected with origin marker 410 in image 408; marker 421 has been moved to the corner selected with marker 411 in image 408; marker 422 has been moved to the corner selected with marker 412 in image 408; and marker 423 has been moved to the corner selected with marker 413 in image 408. In addition, markers 420-423 have been rotated, by operator rotation of the origin marker 420, to align with the major axes of the roof 407.

As noted, the operator can utilize the origin marker 420 to specify the vertical axis of the reference grid. In particular, the operator can adjust (e.g., by dragging with a mouse or other pointing device) arm 420c of marker 420 to specify the vertical (Z) axis of the image. In some cases, aerial images may include some amount of lean, due to the orientation of the aircraft during image capture. For example, pitch, yaw, or roll of an aircraft during the course of image capture may result in images that are misaligned with respect to the vertical axis of the building and its roof. Typically, an operator may adjust arm 420c to line up with a feature of a building or roof that is known to be substantially vertical, such as a wall of a house or a chimney. Then, based on the angle of arm 420c with respect to the vertical axis of the image, the roof estimation system can determine a correction between the reference grid and the image.

FIG. 4F shows an enlarged view of image portion 418 after registration of image 404. Once the operator has placed and adjusted markers 420-423, the operator may direct (e.g., by clicking a button) the roof estimation system to register the image to the reference grid, based on the positions and orientations of markers 420-423. Once the roof estimation system registers the image, it provides the operator with feedback so that the operator may determine the correctness or accuracy of the registration.

In the example of FIG. 4F, the operator has directed the roof estimation system to register image 404, and the roof estimation system has updated image portion 418 with registration indicators 430-433. Registration indicators 430-433 provide the operator with feedback so that the operator may judge the accuracy of the registration of image 404.

Registration indicator 430 is an origin registration indicator that includes two arms 430a-430b and three reference grid indicators 430c-430e, shown as dashed lines. The reference grid indicators 430c-430e show the vertical axis (430c) and the two horizontal axes (430d and 430e) of the reference grid determined based on the placement and orientation of the markers 420-423. Arms 430a and 430b correspond to the placement of arms 420a-420c of origin marker 420. If the arms 430a and 430b do not substantially align with the corresponding reference grid indicators 430e and 430d, then the determined reference grid is out of alignment with the specified axes of the house. Typically, an operator will return to the view of FIG. 4E to make adjustments to origin marker, such as adjusting one or more of the vertical or horizontal axes, in order to refine the registration of the image. Although the arms 430a-430b and the reference grid indicators 430c-430e are here illustrated as solid and dashed lines, in other embodiments they may be color coded. For example, arms 430a-430b may be red, while reference grid indicators 430c-430e may be blue.

Registration indicators 431-433 provide the operator with information regarding the accuracy of the placement of markers 421-423. In particular, each registration indicator 431-433 includes a solid crosshairs and a reference indicator, shown for example as a dashed line 432a. The crosshair of a registration indicator corresponds to the placement of a marker. For example, the crosshairs of registration indicator 431 corresponds to the placement of marker 421 in FIG. 4E. If the reference indicator intersects the center (or substantially near the center) of the crosshairs of a registration indicator, then the operator knows that the placement of the corresponding marker is accurate. On the other hand, if the reference indicator does not intersect the center of the crosshairs of a registration indicator, then the operator knows that the placement of the corresponding marker is inaccurate. Typically, such an inaccuracy arises when the placement of markers in the top view of the roof does not agree with (correspond to) the placement of corresponding markers in another view of the roof. In such cases, the operator can return to the view of FIG. 4C or 4E to adjust the position of one or more markers.

After registering image 404, the operator will proceed to register additional images of the building roof 407 utilizing a process similar to that described above. In this example, the operator will register images 403, 405, and 406. Although the operator is here described as registering a total of five images, in other cases more or fewer images may be registered.

B. Roof Model Construction

FIGS. 5A-5D and 6A-6C generally illustrate aspects of the process of roof model generation based on multiple registered images. In particular, these figures illustrate the construction of a roof model by an operator. Model generation/construction may include identification of roof features shown in various images of the roof, such as edges, planar sections, vertexes, and the like, as well as determination of roof pitch and other dimensional attributes of the roof. Each identified roof feature is incorporated by the roof estimation system into a 3D model of the roof, based on a translation between an image in which the feature is identified and the reference grid, as determined by the process described with reference to FIGS. 4A-4F, above.

Figure 5A:
FIGS. 5A-5D are screen displays illustrating pitch determination in an example embodiment.

FIGS. 5A-5D are screen displays illustrating pitch determination in an example embodiment. In particular, FIG. 5A shows the user interface screen 400 after images 402-406 have been registered. In this example, the operator is using a pitch determination control (also called a "pitch determination marker" or "pitch determination tool") to specify the pitch of a planar roof section of the building roof 407 visible in image 406. The pitch determination control will be further described in FIG. 5B, below, with respect to an enlargement of image portion 508.

Figure 5B:
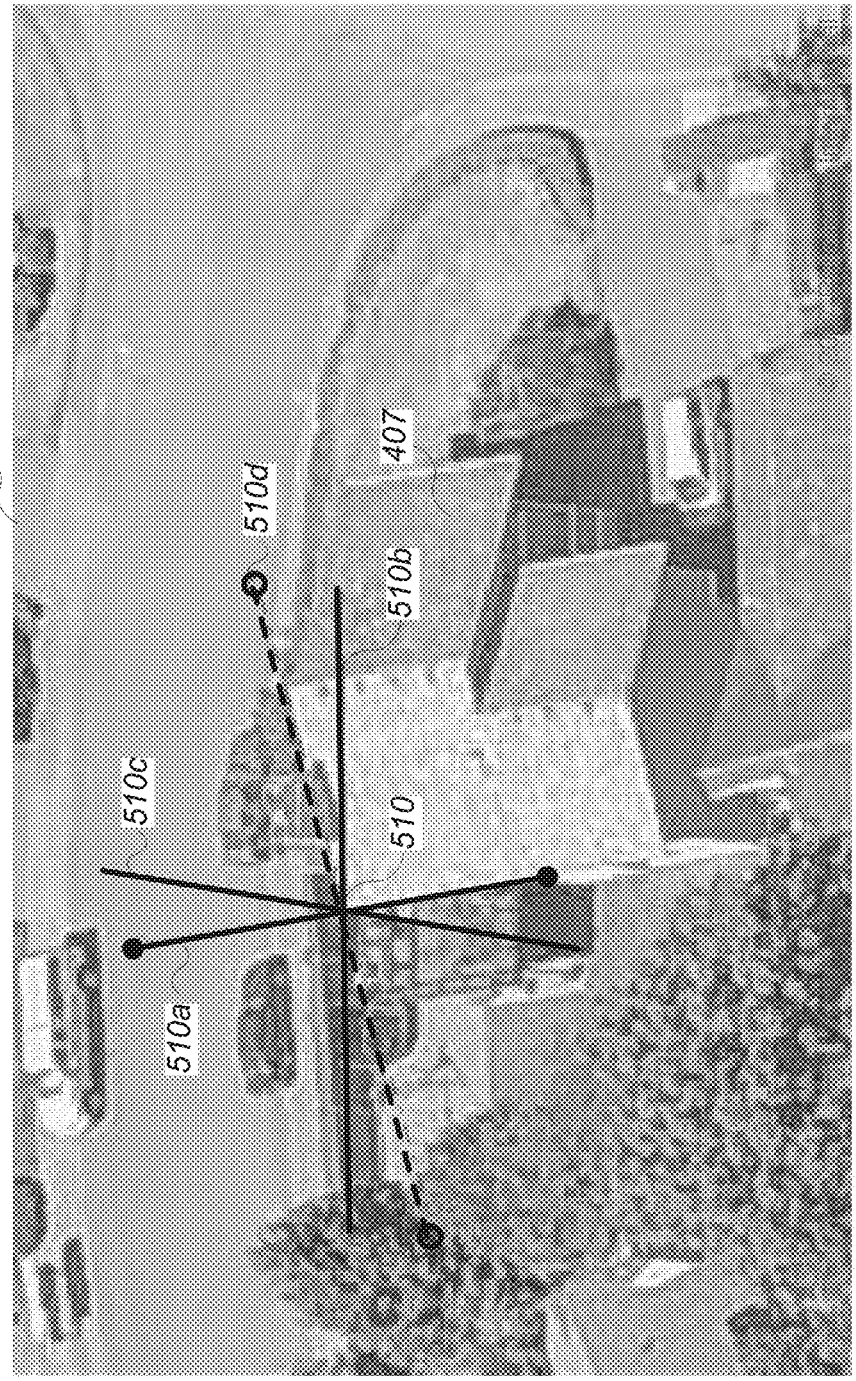

FIG. 5B shows an enlarged view of image portion 508 during the process of pitch determination for image 406, which provides an east perspective view of the building roof 407. As shown in FIG. 5B, the image portion 508 includes the building roof 407 and a pitch determination marker 510 (also called a "protractor tool"). The pitch determination marker 510 is an interactive user interface control that can be directly manipulated by the operator in order to specify the pitch of a section of the building roof 407.

The pitch determination marker 510 includes arms 510a-510d. Arms 510a-510c are axes, which are automatically aligned, based on the registration of image 406, with the major (X, Y, and Z) axes of the building roof. Arm 510d is a "protractor" arm that is adjustable by the operator to specify roof pitch.

The marker 510 is typically first moved by the operator to a convenient location on the building roof 407, usually corner of a planar section of the roof 407. Next, the operator adjusts arm 510d so that it substantially aligns with the sloped edge of the planar roof section. Then, the roof estimation system determines the pitch of the roof section, based on the configuration of the marker 510 with respect to the image and the reference grid.

After specifying the pitch of a planar roof section, the operator will typically specify other information about the planar roof section, such as its outline, as will be described with reference to FIGS. 6A-6D. Note that as the operator provides additional information about the geometry of the roof 407, the roof estimation system may automatically determine the pitch and/or other features of at least some of the other planar roof sections, based on the provided geometric information and/or assumptions about roof symmetry or other standard architectural practices.

Figure 5C:
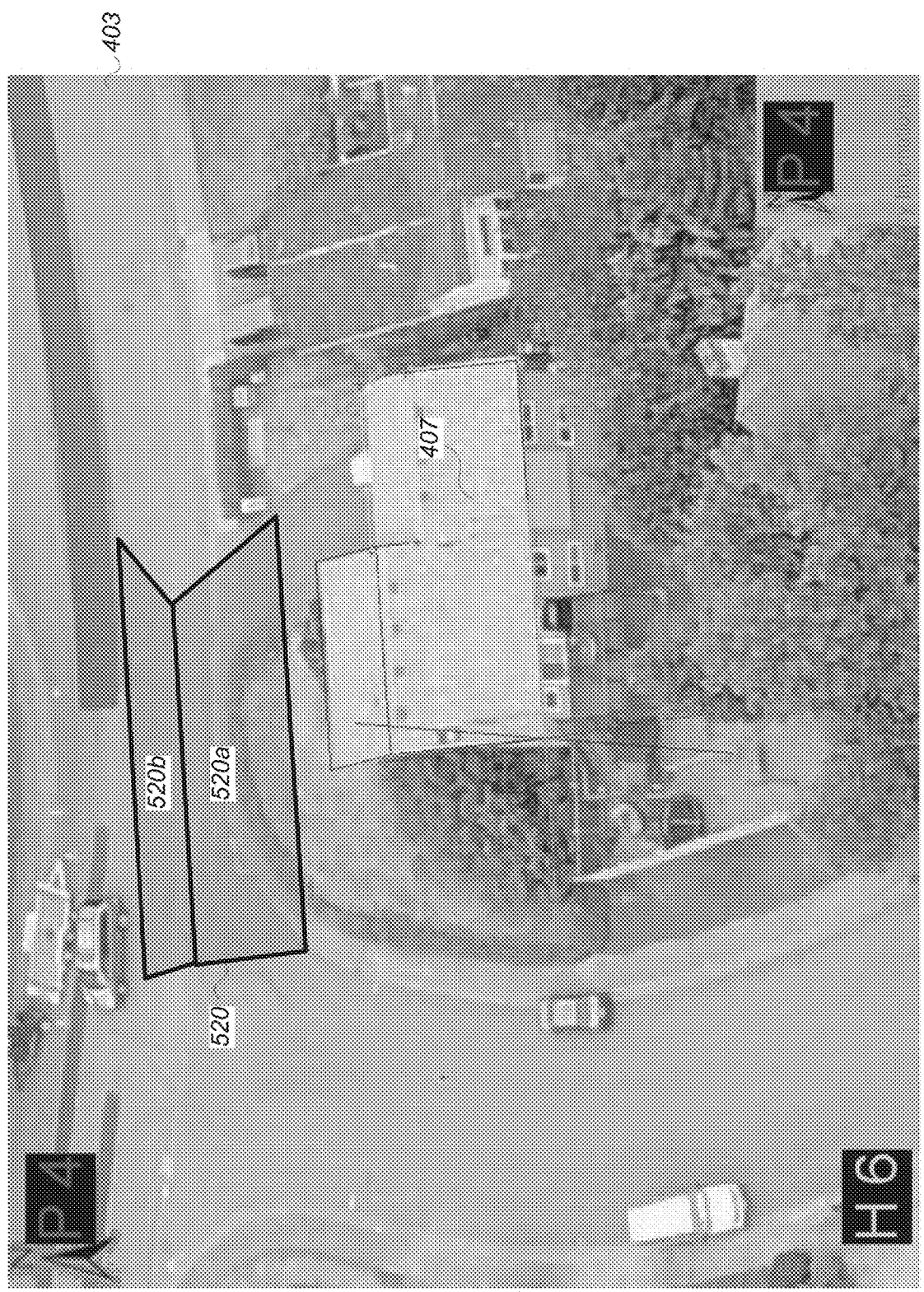

FIG. 5C shows a second type of pitch determination marker being used in the context of image 403 which provides a south perspective view of the building roof 407. The illustrated pitch determination marker may be used in addition to, or instead of, the pitch determination marker 510 described with respect to FIGS. 5A-5B, above. In particular, FIG. 5C shows a pitch determination marker 520 (also called an "envelope tool") that includes surfaces 520a and 520b. The pitch determination marker 520 is an interactive user interface control that can be directly manipulated by the operator in order to specify the pitch of a section of the building roof 407. In particular, the pitch determination marker 520 may be moved and/or adjusted so that it appears to lie substantially atop two adjacent planar sections of roof 407.

Figure 5D:
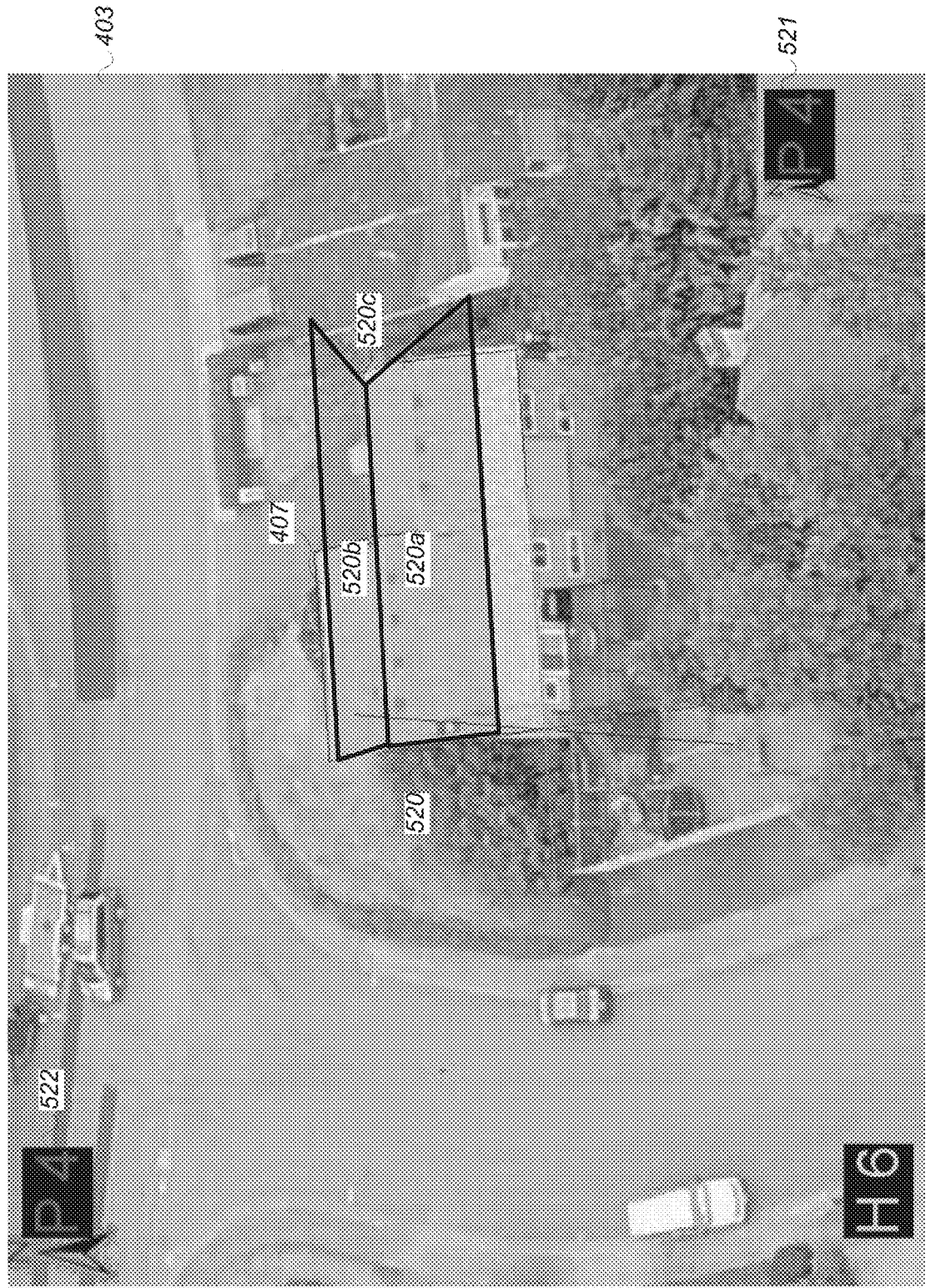

FIG. 5D shows the pitch determination marker 520 after the operator has used it to specify the pitch of two sections of roof 407. Here, the operator has moved the marker 520 to a position in which the spine of the marker 520 is substantially aligned with the ridge line of roof 407. Then, the operator has adjusted the angle of the surfaces 520a and 520b so that they appear to lie substantially atop corresponding sections of roof 407. Then, the roof estimation system determines the pitch of the roof sections, based on the configuration of the marker 520 with respect to the image and the reference grid. Also illustrated are pitch indicators 521 and 522. Pitch indicator 521 corresponds to the measured pitch of surface 520a, and pitch indicator 522 corresponds to the measured pitch of surface 520b. As the operator adjusts the angle of surfaces 520a and/or 520b, the corresponding pitch indicators 521-522 are automatically updated to reflect the determined pitch. In this example, the pitch of both surfaces is given as 4 inches of rise per foot of run.

The envelope pitch determination marker 520 may be adjusted in other ways, to specify pitches for types of roofs other than the gabled roof shown in image 403. For example, when measuring pitch of roof sections that form a roof hip, point 520c may be manipulated by the operator, such as by dragging it to the left or right, to adjust the shape of the surfaces 520a and 520b, so that the surfaces align with the edges formed by the intersection of the sections that form the roof hip.

FIGS. 6A-6D are screen displays illustrating model construction and concurrent display of operator specified roof features in an example embodiment. In particular, FIGS. 6A-6D illustrate the construction of a three dimensional wire frame model of a building roof, based on the specification of roof features by an operator. In addition, FIGS. 6A-6D illustrate the concurrent display of operator specified roof features in multiple views of a building roof.

Figure 6A:
FIGS. 6A-6D are screen displays illustrating model construction and concurrent display of operator specified roof features in an example embodiment.

FIG. 6A shows the user interface screen 400 after images 402-406 have been registered, and after roof pitches have been determined. In this example, the operator is specifying sections of roof 407, visible in image 406, that are to be added to a 3D wire frame model of the roof 407 maintained by the roof estimation system. The specification of roof sections will be further described with reference to enlarged portion 608 of image 406 in FIG. 6B, below. In addition, as the operator specifies roof sections in image 406, the roof estimation system concurrently displays the specified roof sections in each of the other images 402-405. The concurrent display of operator specified roof features will be further described with reference to enlarged portion 609 of image 402 in FIG. 6C, below.

Figure 6B:
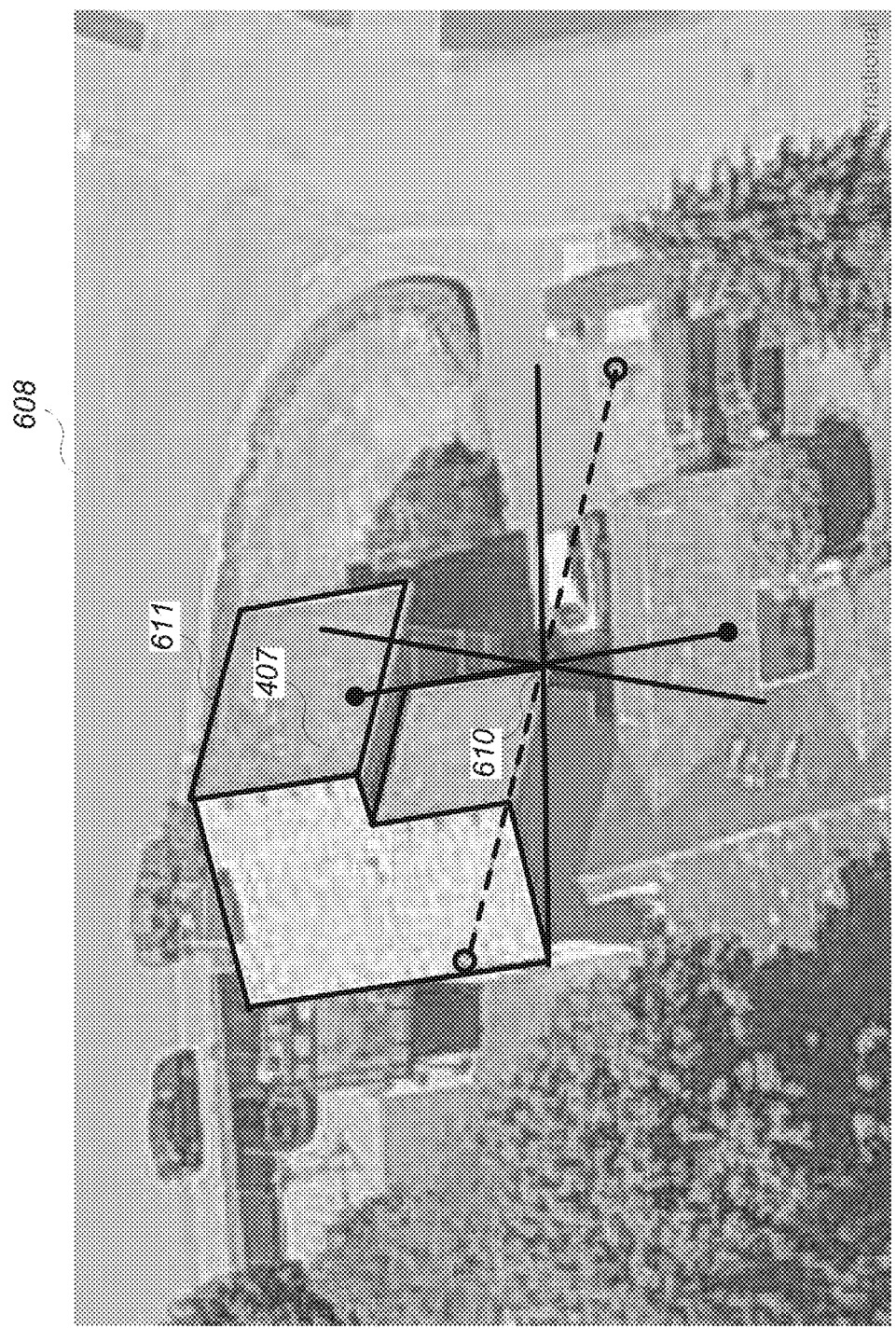

FIG. 6B is an enlarged view of image portion 608 during the process of wire frame model construction in the context of image 406, which provides an east perspective view of the building roof 407. As shown in FIG. 6B, the image portion 608 includes the building roof 407, drawing tool 610, and wire frame 611. The drawing tool 610 (also called a "drawing marker" or a "drawing control") is an interactive user interface control that can be directly manipulated by the operator in order to specify roof features, such as edges, ridges, valleys, corners, etc. In the illustrated embodiment, the operator uses the drawing tool 610 to trace or outline planar sections of the roof 407, leading to the generation of wire frame 611. The drawing tool 610 may be used to establish a series of connected line segments that result in a closed polygon representing a planar roof section. As the operator specifies a planar roof section in this manner, the roof estimation system determines, based on the image and the reference grid, the geometry of the planar roof section, and includes (adds) the specified planar roof section in a 3D model that corresponds to roof 407.

Figure 6C:

FIG. 6C is an enlarged view of image portion 609 illustrating the concurrent display of operator specified roof features, in the context of image 402, which provides a top plan view of the building roof 407. As the operator specifies roof sections as described with respect to FIG. 6B, the roof estimation system concurrently displays the specified roof features in one or more of the other images displayed by the user interface screen 400. More specifically, image portion 609 includes building roof 407 and wire frame 612. Wire frame 612 corresponds to wire frame 611 constructed by the operator with reference to FIG. 6B, except that wire frame 612 is automatically displayed as a projection from the 3D model into the top-down view of image 402. Changes that the operator makes to wire frame 611 are concurrently displayed by the roof estimation system as wire frame 612 in image portion 609. For example, if a new planar roof section is added by the operator to wire frame 611, the new planar roof section is automatically displayed in wire frame 612. By concurrently displaying operator identified features in multiple views of building roof 407, the operator obtains feedback regarding the correctness and/or accuracy of the 3D model or other aspects of the model generation process, such as image registration and pitch determination.

Generally, the roof estimation system can be configured to concurrently display any operator-identified features, such as corners, ridges, valleys, planar sections, and the like, in multiple views of a building.

Furthermore, the concurrently displayed wire frame 612 is an interactive user interface element, in that the operator can make changes to the wire frame 612, which are then concurrently displayed in wire frame 611. Wire frames similar to those described above are also projected by the roof estimation system into images 403, 404, and 405 displayed by the user interface screen 400. In this manner, the operator can switch between various images of the building roof 407, making refinements to the 3D model by adjusting the wire frame in whichever image is more convenient and/or provides a more suitable perspective/view of the model.

Figure 6D:
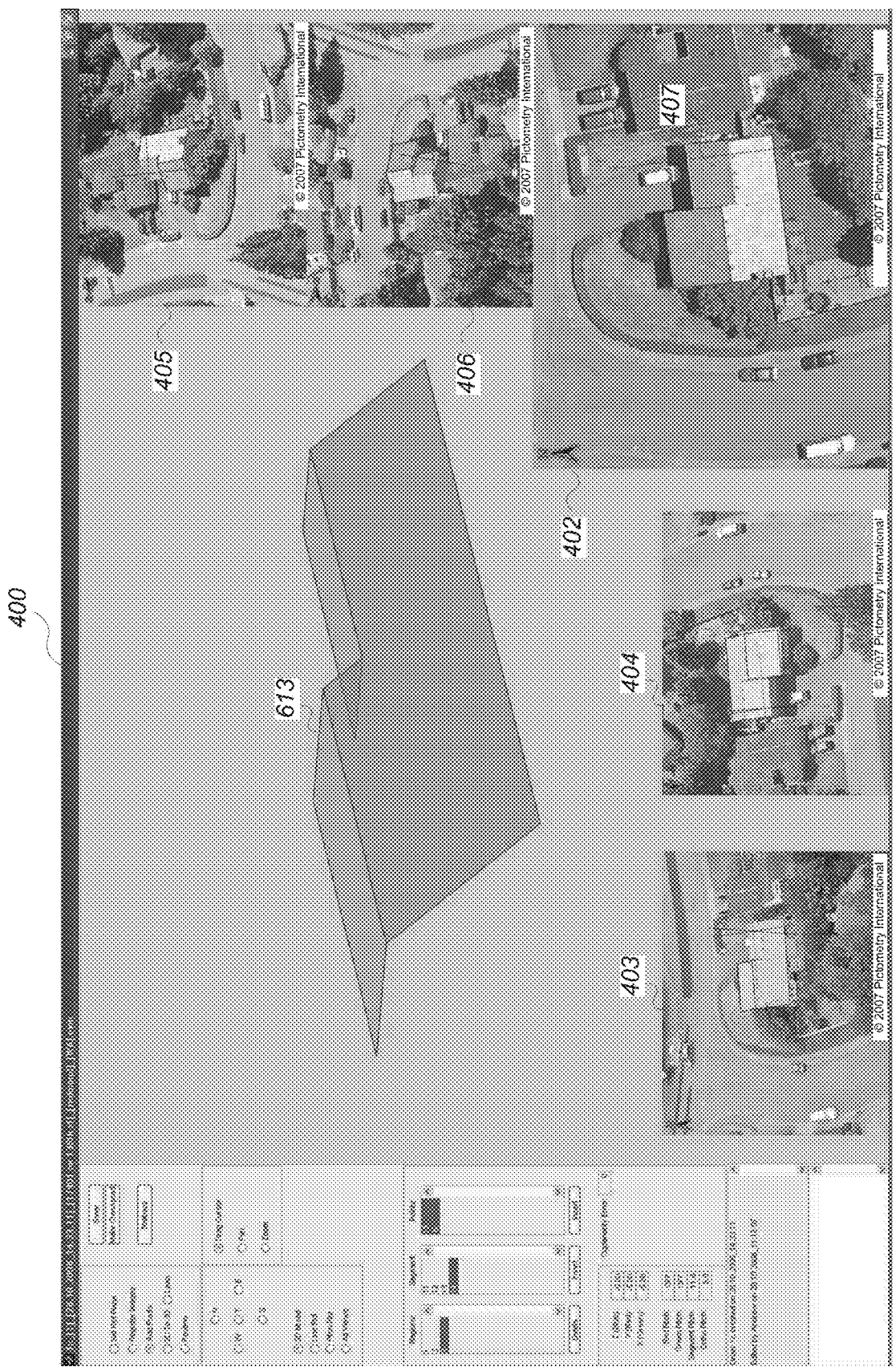

FIG. 6D shows the user interface screen 400 during construction of a 3D model of the building roof 407. In particular, the user interface 400 includes a shaded wire frame 613 representation of the 3D model constructed as described above. In this view, the operator can review the wire frame 613 in isolation from any images to determine whether the wire frame 613 accurately represents the building roof 407. The wire frame 613 is an interactive user interface component, in that it can be directly manipulated (e.g., moved, rotated, resized, etc.). In some embodiments, manipulating the wire frame 613, such as by changing its shape, results in corresponding changes in the underlying 3D model.

C. Roof Model Review

Figure 7A:
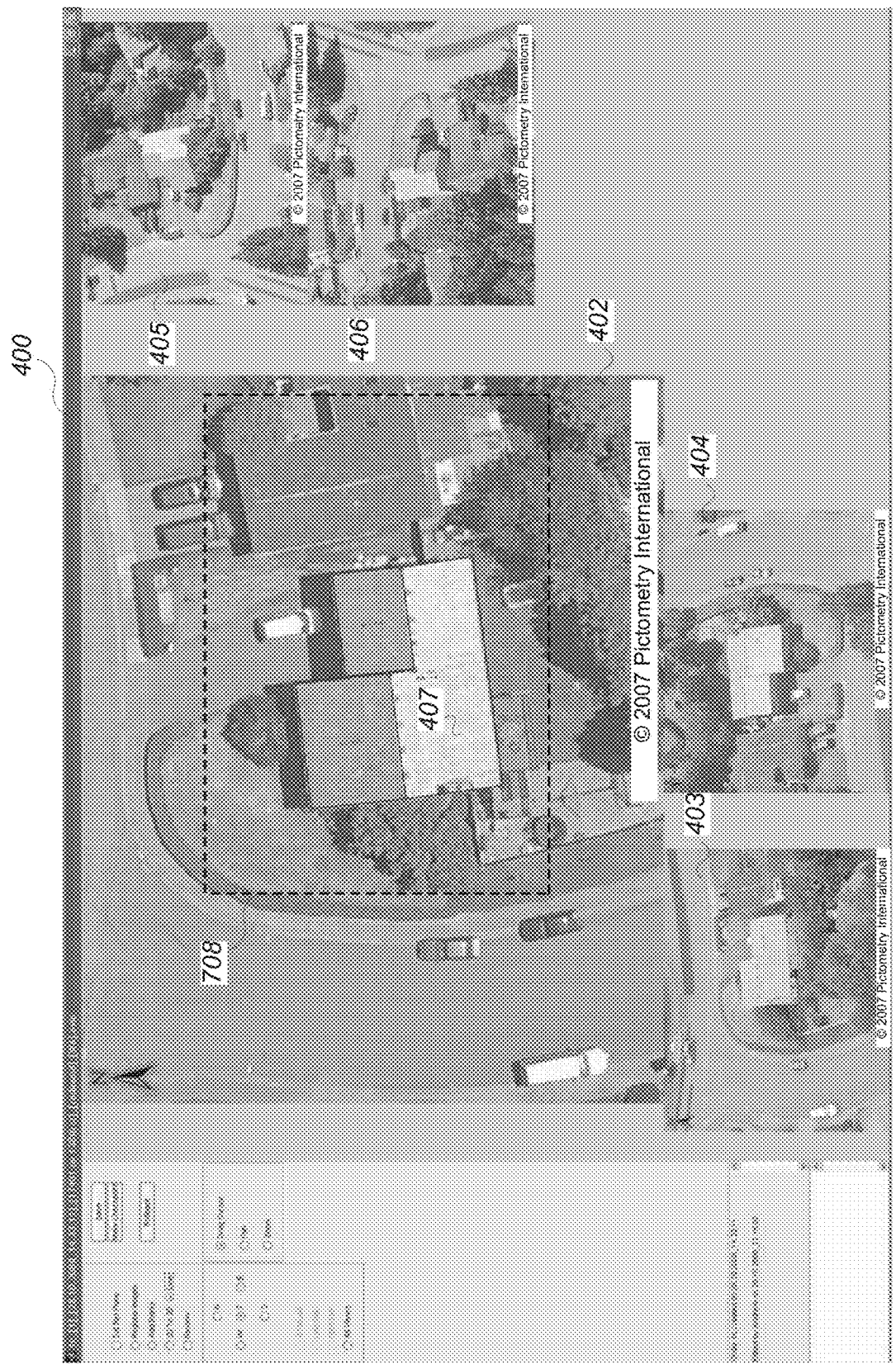
FIGS. 7A-7C are screen displays illustrating roof model review in an example embodiment.
Figure 7B:
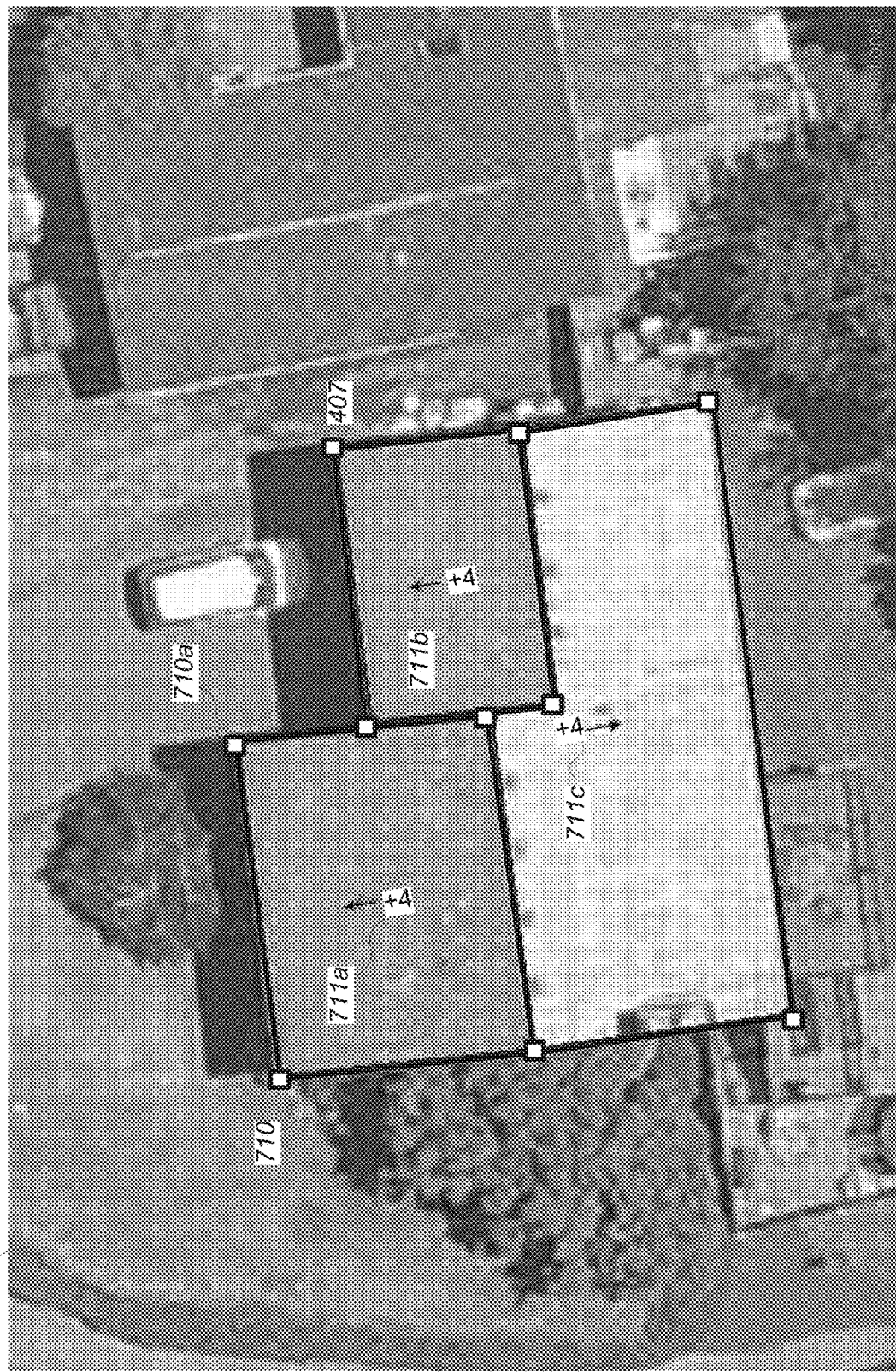
Figure 7C:
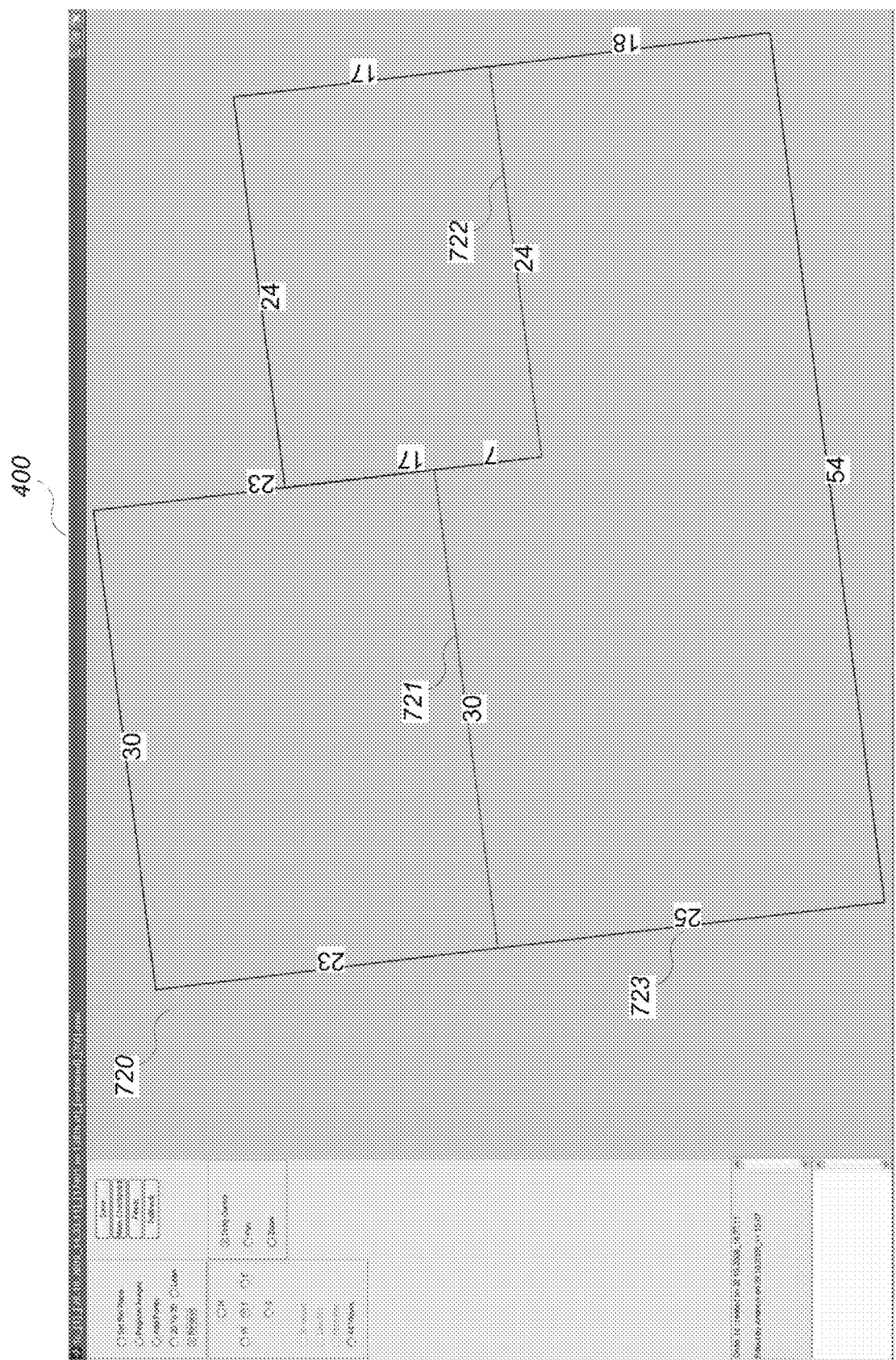

FIGS. 7A-7C are screen displays illustrating roof model review in an example embodiment. In particular, FIGS. 7A-7C illustrate various techniques to facilitate the review of a roof model by an operator. Reviewing the roof model may include reviewing roof section pitches (e.g., to determine whether they conform to the building roof and/or standard construction practices), reviewing the shape and/or location of the roof model (e.g., to determine whether it substantially conforms to the building roof), etc.

FIG. 7A shows the user interface screen 400 after the operator has constructed a model of the roof 407 using one or more of the images 402-406. In this example, a wire frame has been projected onto (superimposed upon) image 402 and annotated with roof section pitches, as will be described further with respect to enlarged portion 708 of image 402 in FIG. 7B, below.

FIG. 7B is an enlarged view of image portion 708 during the process of roof model review in the context of image 402, which provides a substantially top plan view of the building roof 407. As shown in FIG. 7B, the image portion 708 includes a wire frame 710 and labels 711a-711c that indicate pitches of corresponding sections of roof 407. The wire frame 710 and the illustrated pitches are determined by the roof estimation system based on the pitch determination described with respect to FIGS. 5A-5D, above, and the operator's specification of the wire frame model described with respect to FIGS. 6A-6D, above.

The wire frame 710 includes multiple vertexes connected by line segments. Each vertex includes a handle, such as handle 710a. The handles may be directly manipulated (individually or in groups) by the operator to make adjustments/modifications to the wire frame 710. For example, when an operator drags handle 710a to a new location, the ends of the two line segments connected to handle 710a will also move to the new location.

FIG. 7C is an alternative view of the 3D model of roof 407 during the process of roof model review. In FIG. 7C, the user interface screen 400 includes a wire frame 720 representation of the 3D model of the roof 407. The wire frame 720 consists of multiple line segments corresponding to edges of planar roof sections. Each line segment is annotated with a label, such as label 723, indicating the determined length of the corresponding roof section edge. Furthermore, some of the line segments indicate that they correspond to a particular roof feature. For example, line segments 721 and 722 may be colored (e.g., red) so as to indicate that they correspond to roof ridges. Other line segments may be differently colored (e.g., blue) so as to indicate a correspondence to roof valleys or other features. In addition, the wire frame 720 may be directly manipulated by the operator in order to make adjustments to the underlying model of the roof 407. For example, the operator could increase or decrease the length of line segment 721, resulting in a change in the corresponding feature of the 3D model of roof 407.

Note that although the operator is shown, in FIGS. 5-7 above, operating upon a total of five images, in other cases, fewer images may be used. For example, in some cases fewer images may be available, or some images may provide obstructed views of the building roof, such as due to tree cover, neighboring buildings, etc.

3. Implementation Techniques

Figure 8:
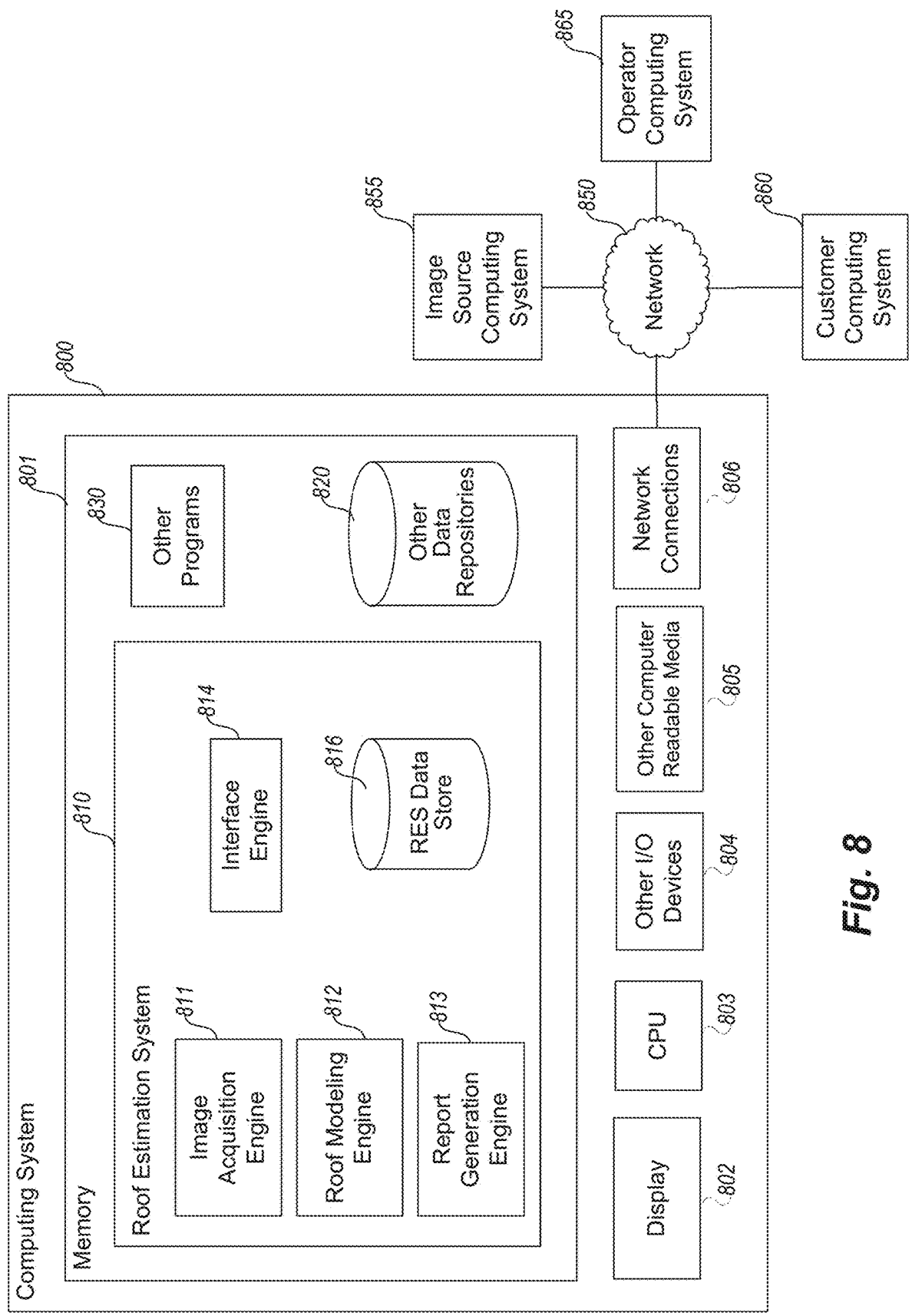
FIG. 8 is an example block diagram of a computing system for practicing embodiments of a roof estimation system.

FIG. 8 is an example block diagram of a computing system for practicing embodiments of a roof estimation system. FIG. 8 shows a computing system 800 that may be utilized to implement a Roof Estimation System ("RES") 810. One or more general purpose or special purpose computing systems may be used to implement the RES 810. More specifically, the computing system 800 may comprise one or more distinct computing systems present at distributed locations. In addition, each block shown may represent one or more such blocks as appropriate to a specific embodiment or may be combined with other blocks. Moreover, the various blocks of the RES 810 may physically reside on one or more machines, which use standard inter-process communication mechanisms (e.g., TCP/IP) to communicate with each other. Further, the RES 810 may be implemented in software, hardware, firmware, or in some combination to achieve the capabilities described herein.

In the embodiment shown, computing system 800 comprises a computer memory ("memory") 801, a display 802, one or more Central Processing Units ("CPU") 803, Input/Output devices 804 (e.g., keyboard, mouse, joystick, track pad, CRT or LCD display, and the like), other computer-readable media 805, and network connections 806. The RES 810 is shown residing in memory 801. In other embodiments, some portion of the contents, some of, or all of the components of the RES 810 may be stored on and/or transmitted over the other computer-readable media 805. The components of the RES 810 preferably execute on one or more CPUs 803 and generate roof estimate reports, as described herein. Other code or programs 830 (e.g., a Web server, a database management system, and the like) and potentially other data repositories, such as data repository 820, also reside in the memory 801, and preferably execute on one or more CPUs 803. Not all of the components in FIG. 8 are required for each implementation. For example, some embodiments embedded in other software do not provide means for user input, for display, for a customer computing system, or other components.

In a typical embodiment, the RES 810 includes an image acquisition engine 811, a roof modeling engine 812, a report generation engine 813, an interface engine 814, and a roof estimation system data repository 816. Other and/or different modules may be implemented. In addition, the RES 810 interacts via a network 850 with an image source computing system 855, an operator computing system 865, and/or a customer computing system 860.

The image acquisition engine 811 performs at least some of the functions of the image acquisition engine 101 described with reference to FIG. 1. In particular, the image acquisition engine 811 interacts with the image source computing system 855 to obtain one or more images of a building, and stores those images in the RES data repository 816 for processing by other components of the RES 810. In some embodiments, the image acquisition engine 811 may act as an image cache manager, such that it preferentially provides images to other components of the RES 810 from the RES data repository 816, while obtaining images from the image source computing system 855 when they are not already present in the RES data repository 816. In other embodiments, images may be obtained in an "on demand" manner, such that they are provided, either by the image acquisition engine 811 or the image source computing system 855, directly to modules of the RES 810 and/or the operator computing system 865, without intervening storage in the RES data repository 816.

The roof modeling engine 812 performs at least some of the functions of the roof modeling engine 102 described with reference to FIG. 1. In particular, the roof modeling engine 812 generates a model based on one or more images of a building that are obtained from the RES data repository 816 or directly from the image source computing system 855. As noted, model generation may be performed semi-automatically, based on at least some inputs received from the computing system 865. In addition, at least some aspects of the model generation may be performed automatically, based on image processing and/or image understanding techniques. After the roof modeling engine 812 generates a model, it stores the generated model in the RES data repository 816 for further processing by other components of the RES 810.

The report generation engine 813 performs at least some of the functions of the report generation engine 103 described with reference to FIG. 1. In particular, the report generation engine 813 generates roof reports based on models stored in the RES data repository 816. Generating a roof report may include preparing one or more views of a given 3D model of a roof, annotating those views with indications of various characteristics of the model, such as dimensions of sections or other features (e.g., ridges, valleys, etc.) of the roof, slopes of sections of the roof, areas of sections of the roof, etc. In some embodiments, the report generation engine 813 facilitates transmission of roof measurement information that may or may not be incorporated into a roof estimate report. For example, the roof generation engine 813 may transmit roof measurement information based on, or derived from, models stored in the RES data repository 816. Such roof measurement information may be provided to, for example, third-party systems that generate roof estimate reports based on the provided information.

The interface engine 814 provides a view and a controller that facilitate user interaction with the RES 810 and its various components. For example, the interface engine 814 implements a user interface engine 104 described with reference to FIG. 1. Thus, the interface engine 814 provides an interactive graphical user interface that can be used by a human user operating the operator computing system 865 to interact with, for example, the roof modeling engine 812, to perform functions related to the generation of models, such as point registration, feature indication, pitch estimation, etc. In other embodiments, the interface engine 814 provides access directly to a customer operating the customer computing system 860, such that the customer may place an order for a roof estimate report for an indicated building location. In at least some embodiments, access to the functionality of the interface engine 814 is provided via a Web server, possibly executing as one of the other programs 830.

In some embodiments, the interface engine 814 provides programmatic access to one or more functions of the RES 810. For example, the interface engine 814 provides a programmatic interface (e.g., as a Web service, static or dynamic library, etc.) to one or more roof estimation functions of the RES 810 that may be invoked by one of the other programs 830 or some other module. In this manner, the interface engine 814 facilitates the development of third-party software, such as user interfaces, plug-ins, adapters (e.g., for integrating functions of the RES 810 into desktop applications, Web-based applications, embedded applications, etc.), and the like. In addition, the interface engine 814 may be in at least some embodiments invoked or otherwise accessed via remote entities, such as the operator computing system 865, the image source computing system 855, and/or the customer computing system 860, to access various roof estimation functionality of the RES 810.

The RES data repository 816 stores information related to the roof estimation functions performed by the RES 810. Such information may include image data 105, model data 106, and/or report data 107 described with reference to FIG. 1. In addition, the RES data repository 816 may include information about customers, operators, or other individuals or entities associated with the RES 810.

In an example embodiment, components/modules of the RES 810 are implemented using standard programming techniques. For example, the RES 810 may be implemented as a "native" executable running on the CPU 803, along with one or more static or dynamic libraries. In other embodiments, the RES 810 is implemented as instructions processed by virtual machine that executes as one of the other programs 830. In general, a range of programming languages known in the art may be employed for implementing such example embodiments, including representative implementations of various programming language paradigms, including but not limited to, object-oriented (e.g., Java, C++, C#, Matlab, Visual Basic.NET, Smalltalk, and the like), functional (e.g., ML, Lisp, Scheme, and the like), procedural (e.g., C, Pascal, Ada, Modula, and the like), scripting (e.g., Perl, Ruby, Python, JavaScript, VBScript, and the like), declarative (e.g., SQL, Prolog, and the like).

The embodiments described above may also use well-known synchronous or asynchronous client-server computing techniques. However, the various components may be implemented using more monolithic programming techniques as well, for example, as an executable running on a single CPU computer system, or alternatively decomposed using a variety of structuring techniques known in the art, including but not limited to, multiprogramming, multithreading, client-server, or peer-to-peer, running on one or more computer systems each having one or more CPUs. Some embodiments execute concurrently and asynchronously, and communicate using message passing techniques. Equivalent synchronous embodiments are also supported by an RES implementation. Also, other functions could be implemented and/or performed by each component/module, and in different orders, and by different components/modules, yet still achieve the functions of the RES.

In addition, programming interfaces to the data stored as part of the RES 810, such as in the RES data repository 816, can be available by standard mechanisms such as through C, C++, C#, and Java APIs; libraries for accessing files, databases, or other data repositories; through scripting languages such as XML; or through Web servers, FTP servers, or other types of servers providing access to stored data. For example, the RES data repository 816 may be implemented as one or more database systems, file systems, memory buffers, or any other technique for storing such information, or any combination of the above, including implementations using distributed computing techniques.

Also, the example RES 810 can be implemented in a distributed environment comprising multiple, even heterogeneous, computer systems and networks. For example, in one embodiment, the image acquisition engine 811, the roof modeling engine 812, the report generation engine 813, the interface engine 814, and the data repository 816 are all located in physically different computer systems. In another embodiment, various modules of the RES 810 are hosted each on a separate server machine and are remotely located from the tables which are stored in the data repository 816. Also, one or more of the modules may themselves be distributed, pooled or otherwise grouped, such as for load balancing, reliability or security reasons. Different configurations and locations of programs and data are contemplated for use with techniques described herein. A variety of distributed computing techniques are appropriate for implementing the components of the illustrated embodiments in a distributed manner including but not limited to TCP/IP sockets, RPC, RMI, HTTP, Web Services (XML-RPC, JAX-RPC, SOAP, and the like).

Furthermore, in some embodiments, some or all of the components of the RES are implemented or provided in other manners, such as at least partially in firmware and/or hardware, including, but not limited to one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), and the like Some or all of the system components and/or data structures may also be stored (e.g., as software instructions or structured data) on a computer-readable medium, such as a hard disk, a memory, a network, or a portable media article to be read by an appropriate drive or via an appropriate connection. The system components and data structures may also be stored as data signals (e.g., by being encoded as part of a carrier wave or included as part of an analog or digital propagated signal) on a variety of computer-readable transmission mediums, which are then transmitted, including across wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of this disclosure may be practiced with other computer system configurations.

Figure 9:
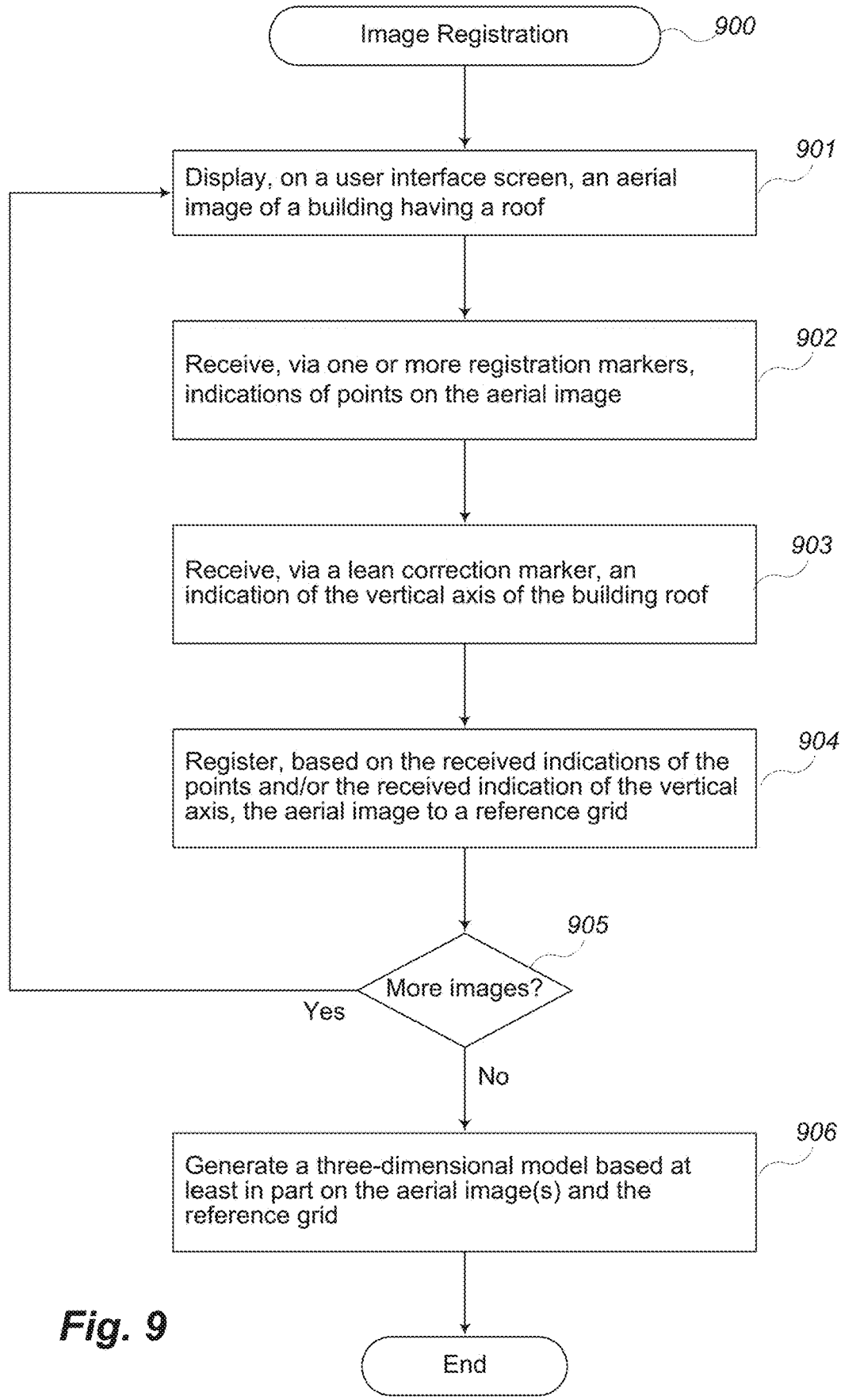
FIG. 9 is an example flow diagram of an image registration routine provided by an example embodiment.

FIG. 9 is an example flow diagram of an image registration routine provided by an example embodiment. The illustrated routine 900 may be provided by, for example, execution of the roof estimation system 810 described with respect to FIG. 8. The illustrated routine 900 facilitates image registration based upon operator indicated registration points and/or image lean corrections.

More specifically, the routine begins in step 901, where it displays, on a user interface screen, an aerial image of a building having a roof. As part of the user interface screen, the routine also displays user interface controls such as markers that may be used by an operator for purposes of image registration and/or lean correction, as described with reference to FIG. 4A, above.

In step 902, the routine receives, via one or more registration markers, indications of one or more points on the aerial image. The registration markers are manipulated by the operator to specify points on the aerial image, as described with reference to FIGS. 4A-4E. Typically, the points are visually identifiable features, such as corners of the roof of the building. For example, if the roof has four corners (e.g., a northwest, southwest, northeast, and southwest corner) the operator may place one registration marker on each of the four corners as shown in the aerial image. Then, the positions (e.g., coordinates on the aerial image) of the markers are transmitted to the routine for use in registering the aerial image, as described below.

In step 903, the routine receives, via a lean correction marker, an indication of the vertical axis of the building roof. In at least some cases, the aerial image of the building is out of alignment with respect to the vertical axis of the building. This may be caused, for example, by pitch, roll, and/or yaw experienced by the aircraft during the process of photographing the building. To correct for such misalignment, the lean correction marker is manipulated by the operator to indicate a vertical axis of the building. Typically, the operator aligns the lean correction marker with known, substantially vertical feature of the building, such as a chimney, wall corner, etc., as described with reference to FIG. 4E, above. After the operator has aligned the lean correction marker, the position (e.g., angle of the marker, coordinates of the endpoints of the marker, etc.) of the lean correction marker is transmitted to the routine for use in registering the aerial image, as described below.

Particular benefits may be obtained from lean correction performed in the context of an overhead, or "top down," view. An "overhead lean" occurs when the camera is not directly overhead with respect to the building when the photo is taken. In some cases, leans in excess of 5 degrees have been observed in "top down" photos. Furthermore, unlike oblique, perspective views, a top-down lean is typically less likely to include a convenient visual marker that provides sufficient angle to assess the lean direction and magnitude, such as the edge of the building or a tall chimney. An overhead lean affects the perceived location of the roof lines in a top down view. This effect is amplified as the pitch of the roof increases and/or as the vertical separation between disconnected roof sections increases. Without lean correction, superimposing a wire frame over the visible ridgelines (and other features of a building that reside at different elevations) may produce asymmetries in otherwise symmetric structures. Further, an absence of lean correction may introduce errors in pitch estimation, as the wire frame may not appear consistent between top and oblique view points. More specifically, without top view lean correction, the positions for the roof lines in an otherwise correct (i.e., accurate with respect to the actual geometry of the roof) wire frame will typically not line up on the visible roof lines in the overhead reference photo. This often leads the user (or software) to either introduce errors by incorrectly drawing the wire frame to the image lines or perform a subjective determination of where and how to shift the wire frame lines off the image lines to produce a correct model. Top view lean correction allows the roof estimation system to trace to, or substantially to, the actual roof lines seen in the top image while still producing an accurate wire frame model.

Image misalignment may be specified in other ways. For example, in other embodiments, the operator may instead rotate the image to a position in which the building appears to be in a substantially vertical position. Then, the angle of rotation of the image may be transmitted to the routine for use in registering the aerial image.

In step 904, the routine registers, based on the received indications of the points and/or the received indication of the vertical axis, the aerial image to a reference grid. Registering the image to a reference grid may include determining a transformation between the reference grid and the image, based on the indicated points and/or the indicated vertical axis. Determining such a transformation may be based on other information as well, such as meta-information associated with the aerial image. In some embodiments, the aerial image has corresponding meta-information that includes image capture conditions, such as camera type, focal length, time of day, camera position (e.g., latitude, longitude, and/or elevation), etc.

In step 905, the routine determines whether there are additional aerial images to be registered, and if so, returns to step 901, else proceeds to step 906. During execution of the loop of steps 901-905, the operator typically indicates, for each registration marker, the same feature (e.g., corner) of the roof as shown in each of multiple images, such that the routine can register the multiple images to a single, uniform reference grid. Upon completion of the registration process, the routine has determined a uniform coordinate system for the multiple aerial images, for use during other phases of model construction, such as pitch determination or feature identification.

In step 906, the routine generates a three-dimensional model based at least in part on the aerial image(s) and the reference grid. As discussed above with reference to FIGS. 5A-5D and 6A-6D, model generation includes identification of roof features shown in various images of the roof, such as edges, planar sections, vertexes, and the like, as well as determination of roof pitch and other dimensional attributes of the roof. In other embodiments, the routine performs other functions with the registered images, such as storing them for later use (e.g., by an automated model generation module), transmitting them to another computing (e.g., for use in a third-party design application), etc. After step 906, the routine ends.

Note that in at least some embodiments, aspects of the routine 900 may be performed in an automated manner. For example, operations discussed above as being performed by an operator, such as the determination of the location of image registration points of step 902 and/or the indication of lean of step 903, may be performed by automated image processing techniques.

Figure 10:
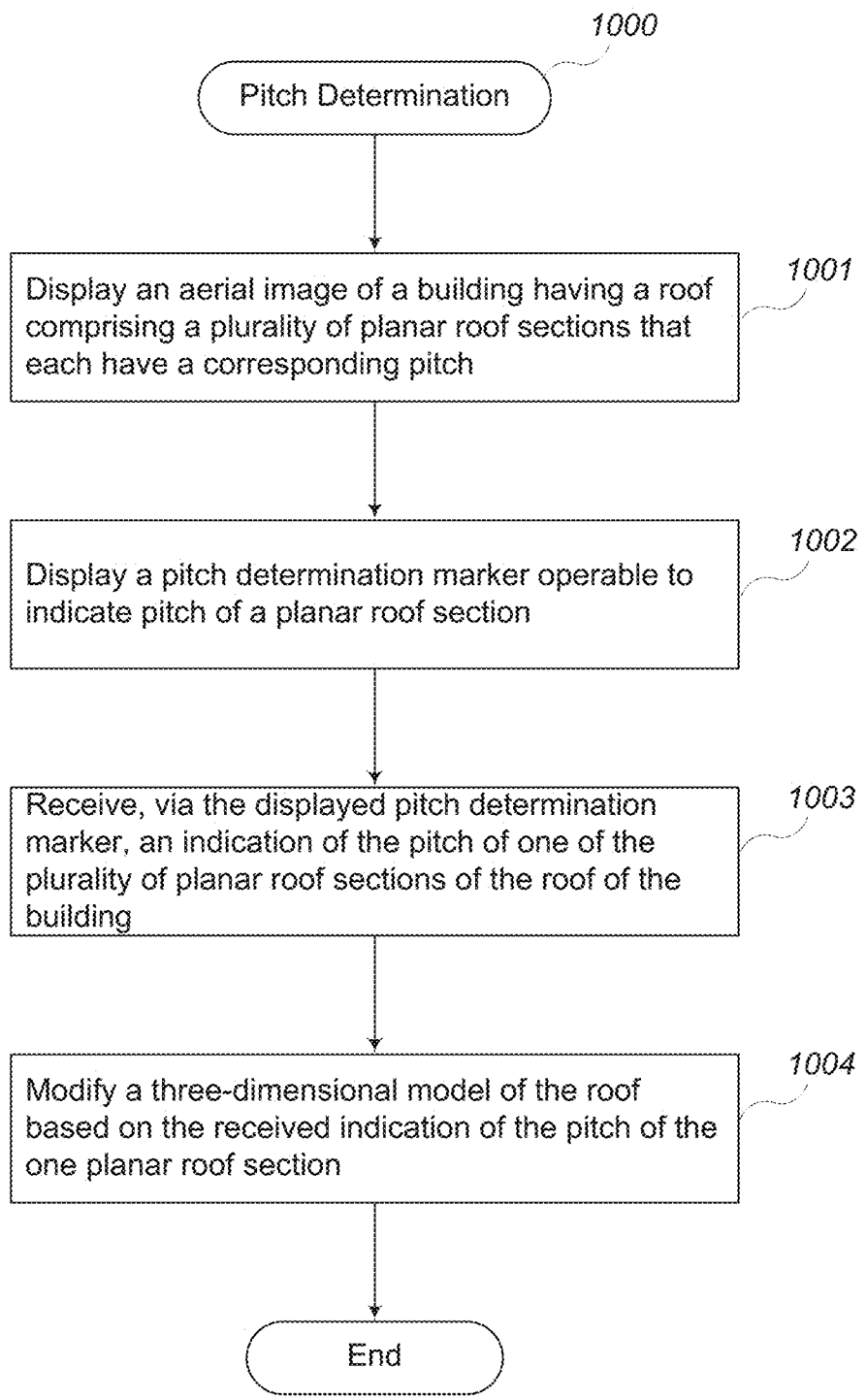
FIG. 10 is an example flow diagram of a pitch determination routine provided by an example embodiment.

FIG. 10 is an example flow diagram of a pitch determination routine provided by an example embodiment. The illustrated routine 1000 may be provided by, for example, execution of the roof estimation system 810 described with respect to FIG. 8. The illustrated routine 1000 facilitates the determination of the pitch of a section of a roof, by displaying a pitch determination marker and modifying a 3D model of a roof based on an indication of roof pitch received via the pitch determination marker.

More specifically, the routine begins at step 1001 where it displays an aerial image of a building having a roof comprising a plurality of planar roof sections that each have a corresponding pitch. The aerial image is displayed in the context of a user interface screen, such as is described with reference to FIGS. 4A-6C, above. The aerial images may be received from, for example, the image source computing system 855 and/or from the RES data repository 816 described with reference to FIG. 8. As discussed above, aerial images may be originally created by cameras mounted on airplanes, balloons, satellites, etc. In some embodiments, images obtained from ground-based platforms (e.g., vehicle-mounted cameras) may be used instead or in addition.

In step 1002, the routine displays a pitch determination marker operable to indicate pitch of a planar roof section. The pitch determination marker may be, for example, a pitch determination marker 510 ("protractor tool") or 520 ("envelope tool"), such as are respectively described with respect to FIGS. 5B and 5C, above. The routine displays the pitch determination marker by, for example, presenting it on a user interface screen displayed on a computer monitor or other display device. The pitch determination marker is a direct manipulation user interface control, in that an operator may manipulate it (e.g., adjust an angle, change its shape, alter its position, etc.) in order to indicate pitch of a planar roof section. Additional details regarding pitch determination controls are provided with respect to FIGS. 5A-5D, above.

In step 1003, the routine receives, via the displayed pitch determination marker, an indication of the pitch of one of the plurality of planar roof sections of the roof of the building. Receiving an indication of the pitch includes receiving an indication (e.g., via an event, callback, etc.) that the marker has been manipulated by the operator, and then determining an angle based on the shape and/or position of the marker. In some embodiments, such an indication may be received on an event driven basis, such as every time the marker is manipulated in some manner. In other embodiments, the routine may poll the marker from time to time to determine its current state. In addition, the operator may explicitly indicate that the current state of the marker is to be transmitted to the routine, such as by pressing a button or other indication.

In step 1004, the routine modifies a three-dimensional model of the roof based on the received indication of the pitch of the one planar roof section. Modifying the 3D model of the roof includes associating the indicated pitch with a portion of the model corresponding to the one planar roof section. For example, the 3D model may include one or more data structures representing planar roof sections, and the indicated pitch may be included as part of the data structure representing the one planar roof section. In some embodiments, the 3D model may not at this point include representations of the planar roof sections, such as because the operator has not yet specified them. In such a case, the routine may store the indicated pitch in association with the location and orientation at which the pitch was specified by the operator, as determined from the aerial image. Then, at a later time, when the operator specifies a roof section that has the same orientation as the stored pitch and that includes or is near the stored location, the roof estimation system can store the indicated pitch in association with the specified roof section.

After step 1004, the routine ends. In other embodiments, the routine may instead return to step 1001, to determine the pitch for another planar roof section (of the same or different roof).

Figure 11:
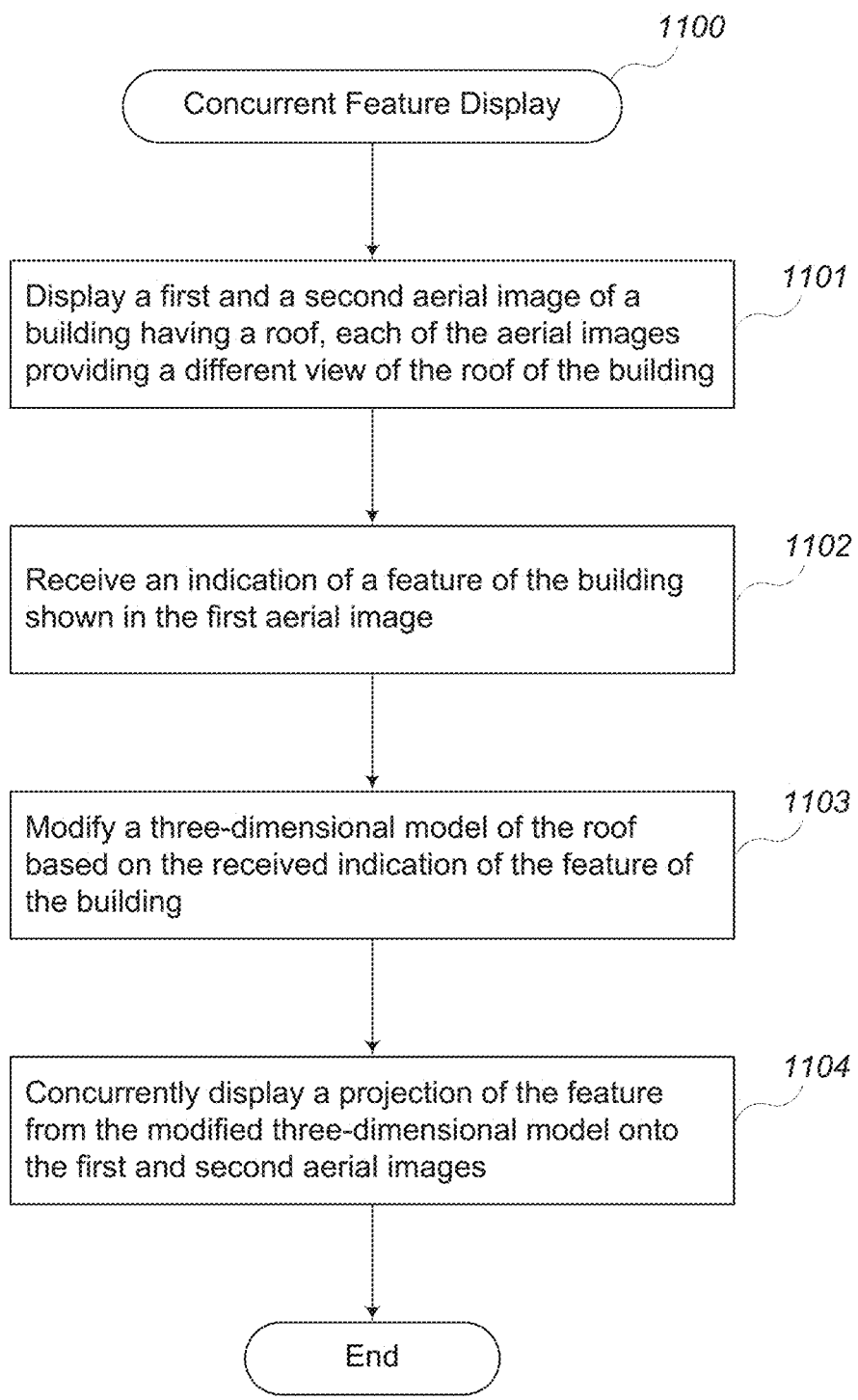
FIG. 11 is an example flow diagram of concurrent feature display routine provided by an example embodiment.

FIG. 11 is an example flow diagram of concurrent feature display routine provided by an example embodiment. The illustrated routine 1100 may be provided by, for example, execution of the roof estimation system 810 described with respect to FIG. 8. The illustrated routine 1100 concurrently displays operator indicated features in multiple aerial images of a building roof.

More specifically, the routine begins in step 1101, where it displays a first and a second aerial image of a building having a roof, each of the aerial images providing a different view of the roof of the building. The aerial images are displayed in the context of a user interface screen, such as is described with reference to FIGS. 6A-6C, above.

In step 1102, the routine receives an indication of a feature of the building shown in the first aerial image. The indication is typically received via a user interface control, such as a drawing tool or marker, upon its manipulation by an operator. For example, the operator may manipulate a drawing tool in order to specify one or more features of the building roof, such as a corner on the roof, an edge of the roof, an outline of a section of the roof, etc. In one embodiment, the operator utilizes a drawing tool to indicate roof section corner points and roof section edges connecting those corner points. Additional details regarding feature indication are provided with respect to FIGS. 6A-6C, above.

In step 1103, the routine modifies a three-dimensional model of the roof based on the received indication of the feature of the building. Modifying the 3D model may include adding or updating the indicated feature to a wire frame model of the roof. For example, if the indicated feature is a roof section corner point, the corner point will be added to the 3D model, along with the location (e.g., the X, Y, and Z position of the point) of the point. The location of the point is automatically determined based on a translation of the position of the point in the image to a point in the uniform reference grid associated with the image. If the indicated feature is a roof section edge, the edge will be added to the 3D model, such as by associating the edge with two points corresponding to the end points of the edge. Higher-level features can also be indicated. For example, a planar roof section may be indicated by "closing" a sequence of two or more connected line segments, to create a closed polygon that represents the outline or perimeter of the planar roof section.

In step 1104, the routine concurrently displays a projection of the feature from the modified three-dimensional model onto the first and second aerial images. In one embodiment, displaying the feature from the modified three-dimensional model includes projecting the three-dimensional model onto both the first and second aerial images. For example, if the first image (for which the indicated feature was received) provides a west view of the building, and the second image provides an east view of the building, the routine will concurrently display a projection of the indicated feature from the 3D model onto both the first and second images. The projection of the indicated feature into the second image is based at least in part on a translation from the position of the feature in the reference grid to a position in the second image. In addition, the concurrent display onto two or more images occurs at substantially the same time (within a short time interval, at times that are substantially coincident) as the indication of the feature of the building in step 1102, giving the operator the illusion that as they are indicating a feature in the first image, the feature is being simultaneously projected into the second image.

After step 1104, the routine ends. In other embodiments, the routine may instead return to step 1101, to perform an interactive loop of steps 1101-1104 with the operator, so that the routine can concurrently display multiple features as they are indicated by the operator. Note that in such an embodiment, each iteration of the loop of steps 1101-1104 may be performed at near real-time speeds, so as to provide a fluid, interactive model generation experience for the operator enabling the operator to drag, draw, or otherwise indicate/manipulate features in a first image and view the results of their work concurrently projected into a second image.

All of the above U.S. patents, U.S. patent application publications, U.S. patent applications, foreign patents, foreign patent applications and non-patent publications referred to in this specification and/or listed in the Application Data Sheet, including but not limited to U.S. Provisional Patent Application No. 61/197,904, entitled "USER INTERFACE SYSTEMS AND METHODS FOR ROOF ESTIMATION," filed Oct. 31, 2008, are incorporated herein by reference, in their entireties.

From the foregoing it will be appreciated that, although specific embodiments have been described herein for purposes of illustration, various modifications may be made without deviating from the spirit and scope of the present disclosure. For example, the methods, systems, and techniques for generating and providing roof estimate reports discussed herein are applicable to other architectures other than the illustrated architecture or a particular roof estimation system implementation. Also, the methods and systems discussed herein are applicable to differing network protocols, communication media (optical, wireless, cable, etc.) and devices (such as wireless handsets, electronic organizers, personal digital assistants, portable email machines, game machines, pagers, navigation devices such as GPS receivers, etc.). Further, the methods and systems discussed herein may be utilized by and/or applied to other contexts or purposes, such as by or for solar panel installers, roof gutter installers, awning companies, HVAC contractors, general contractors, and/or insurance companies.

What is claimed is:

1. A computer-implemented method, comprising:
   displaying an aerial image of a building having a roof comprising a plurality of planar roof sections that each have a corresponding pitch;
   displaying an interactive user interface control configured to be manipulated by an operator to align with a slope of a first planar roof section of the plurality of planar roof sections in order to specify pitch of the first planar roof section, wherein the interactive user interface control is overlaid on the aerial image of the building having the roof;
   receiving, based on alignment of the displayed interactive user interface control, an indication of the pitch of the first planar roof section of the plurality of planar roof sections of the roof of the building;
   modifying a model of the roof based on the received indication of the pitch of the first planar roof section; and
   generating and output a roof estimate report using a report generation engine, wherein the roof estimate report includes numerical values annotated with corresponding slope, pitches, total area of the roof, identification and measurement of ridges and valleys of the roof, different elevation views rendered from a 3D model of the roof, and lengths of corresponding roof section for each line segment of edges of a plurality of planar roof sections of the roof, wherein the generated roof estimate report is provided for repair or construction of a corresponding roof structure of the building.

2. The method of claim 1, wherein the interactive user interface control is configured to be manipulated by the operator to lie atop the first planar roof section and an adjacent second planar roof section of the plurality of planar roof sections.

3. The method of claim 1, wherein the interactive user interface control is configured to be manipulated by the operator to adjust the shape of the user interface control.

4. The method of claim 3, wherein the interactive user interface control is configured to be manipulated by the operator to adjust the shape of the user interface control, such that the user interface control aligns with the roof.

5. The method of claim 1, further comprising displaying the model of the roof.

6. The method of claim 1, wherein the user interface control is a wire frame.

7. The method of claim 1, further comprising modifying the model of the roof based on the user interface control.

8. The method of claim 1, wherein the interactive user interface control is adjustable to specify pitch of one or more of the plurality of planar roof sections.

9. The method of claim 1, further comprising transmitting roof measurement information based on the modified model of the roof, the roof measurement information including a measure of the pitch of the first planar roof section.

10. The method of claim 1, wherein modifying the model of the roof includes associating the indicated pitch with a portion of the model of the roof that corresponds to the first planar roof section of the roof of the building.

11. The method of claim 1, further comprising displaying a wireframe rendering of the modified model superimposed on the aerial image of the building.

12. The method of claim 11, wherein displaying the wireframe rendering occurs in response to the receiving of the indicated pitch.

13. The method of claim 1 wherein modifying the model of the roof includes modifying a three-dimensional model of the roof.

14. A computing system, comprising:
a memory;
one or more computer processor configured to execute computer software stored on the memory, that, when executed, causes the computer processor to:
display an aerial image of a building having a roof comprising a plurality of planar roof sections that each have a corresponding pitch;
display an interactive user interface control configured to be manipulated by an operator to align with a slope of a first planar roof section of the plurality of planar roof sections in order to specify pitch of the first planar roof section, wherein the interactive user interface control is overlaid on the aerial image of the building having the roof;
receive, based on alignment of the displayed interactive user interface control, an indication of the pitch of the first planar roof section of the plurality of planar roof sections of the roof of the building;
modify a model of the roof based on the received indication of the pitch of the first planar roof section; and
generate and output a roof estimate report using a report generation engine, wherein the roof estimate report includes numerical values annotated with corresponding slope, pitches, total area of the roof. identification and measurement of ridges and valleys of the roof, different elevation views rendered from a 3D model of the roof, and lengths of corresponding roof section for each line segment of edges of a plurality of planar roof sections of the roof, wherein the generated roof estimate report is provided for repair or construction of a corresponding roof structure of the building.

15. The computing system of claim 14, wherein the interactive user interface control is configured to be manipulated by the operator to lie atop the first planar roof section and an adjacent second planar roof section of the plurality of planar roof sections.

16. The computing system of claim 14, wherein the interactive user interface control is configured to be manipulated by the operator to adjust the shape of the user interface control.

17. The computing system of claim 16, wherein the interactive user interface control is configured to be manipulated by the operator to adjust the shape of the user interface control, such that the user interface control aligns with the roof.

18. The computing system of claim 14, the computer processor configured to execute computer software stored on the memory, that, when executed, further causes the computer processor to display the model of the roof.

19. The computing system of claim 14, wherein the user interface control is a wire frame.

20. The computing system of claim 14, further comprising modifying the model of the roof based on the user interface control.

* * * * *